US011236426B2

(12) United States Patent
Hamers et al.

(10) Patent No.: US 11,236,426 B2
(45) Date of Patent: Feb. 1, 2022

(54) PLASMONIC DIAMOND FILMS AND RELATED METHODS

(71) Applicant: Wisconsin Alumni Research Foundation, Madison, WI (US)

(72) Inventors: Robert John Hamers, Madison, WI (US); Shuo Li, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 474 days.

(21) Appl. No.: 16/104,460

(22) Filed: Aug. 17, 2018

(65) Prior Publication Data

US 2019/0071779 A1    Mar. 7, 2019

Related U.S. Application Data

(60) Provisional application No. 62/554,713, filed on Sep. 6, 2017.

(51) Int. Cl.
| | | |
|---|---|---|
| *C23C 16/27* | (2006.01) | |
| *C23C 16/06* | (2006.01) | |
| *C23C 16/56* | (2006.01) | |
| *B01J 35/00* | (2006.01) | |
| *C23C 14/18* | (2006.01) | |
| *C23C 16/02* | (2006.01) | |
| *B01J 23/50* | (2006.01) | |
| *C23C 16/30* | (2006.01) | |

(52) U.S. Cl.
CPC .............. *C23C 16/56* (2013.01); *B01J 23/50* (2013.01); *B01J 35/004* (2013.01); *B01J 35/0013* (2013.01); *C23C 14/18* (2013.01); *C23C 16/0281* (2013.01); *C23C 16/06* (2013.01); *C23C 16/27* (2013.01); *C23C 16/274* (2013.01); *C23C 16/30* (2013.01)

(58) Field of Classification Search
CPC ................. C23C 16/06; C23C 16/274; C23C 16/27–279; C23C 14/06; C23C 14/14; C23C 16/271; C23C 16/56; C23C 14/18
USPC ....................................................... 427/249.8
See application file for complete search history.

(56) References Cited

U.S. PATENT DOCUMENTS

| | | | | |
|---|---|---|---|---|
| 2004/0221796 | A1* | 11/2004 | Swain | .................... C23C 16/278 |
| | | | | 117/84 |
| 2008/0166479 | A1* | 7/2008 | Lee | ........................ C23C 16/042 |
| | | | | 427/249.8 |
| 2010/0084634 | A1* | 4/2010 | Gamo | ................. H01L 21/0237 |
| | | | | 257/40 |

OTHER PUBLICATIONS

Mitani et al. Formation of self-assembled platinum particles on diamond and their embedding in diamond by microwave plasma chemical vapor depositions. Diamond & Related Materials 15, p. 1544-1549. (Year: 2006).*

(Continued)

*Primary Examiner* — Elizabeth A Burkhart
(74) *Attorney, Agent, or Firm* — Bell & Manning, LLC; N. Meredith Porembski

(57) ABSTRACT

Methods of forming plasmonic diamond films are provided. In an embodiment, such a method comprises forming a first layer of diamond on a substrate; depositing a layer of a metal on a surface of the first layer of diamond to form an as-deposited layer of metal; exposing the as-deposited layer of metal to a plasma treatment to convert the as-deposited layer of metal to a plurality of discrete regions of the metal on the surface of the first layer of diamond; and forming a second layer of diamond on the plurality of discrete regions of metal to form the plasmonic diamond film comprising a plurality of plasmonic nanoparticles.

20 Claims, 22 Drawing Sheets

(56) References Cited

OTHER PUBLICATIONS

Shen et al., Optical, electrical and microstructural properties of nanocomposite Ag/diamond by Ag ion implantation and subsequent annealing, Vacuum 123, Nov. 5, 2015, pp. 160-166.
Meskinis et al, Annealing Effects on Structure and Optical Properties of Diamond-Like Carbon Films Containing Silver, Nanoscale Research Letters 11:146, Mar. 15, 2016, pp. 1-9.
Tsujimoto et al., Fabrication of nano-sized platinum particles self-assembled on and in CVD diamond films, Applied Surface Science 237, Aug. 5, 2004, pp. 488-493.
Babchenko et al., Fabrication of diamond-coated germanium ATR prisms for IR-spectroscopy, Vibrational Spectroscopy 84, Mar. 3, 2016, pp. 67-73.
T. Lopez-Rios, Diamond films studied by surface-enhanced Raman scattering, Diamond and Related Materials 5, May 1996, pp. 608-612.

* cited by examiner

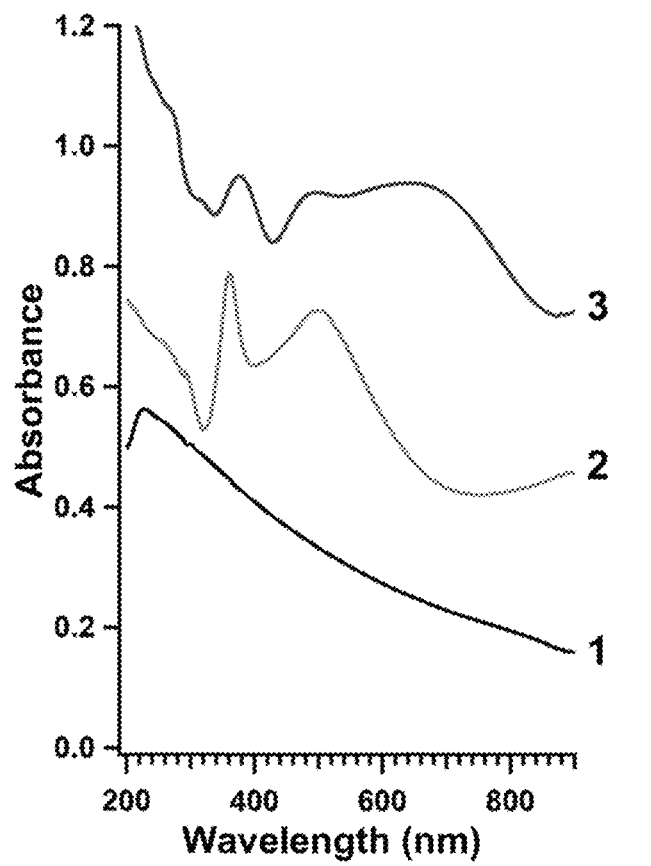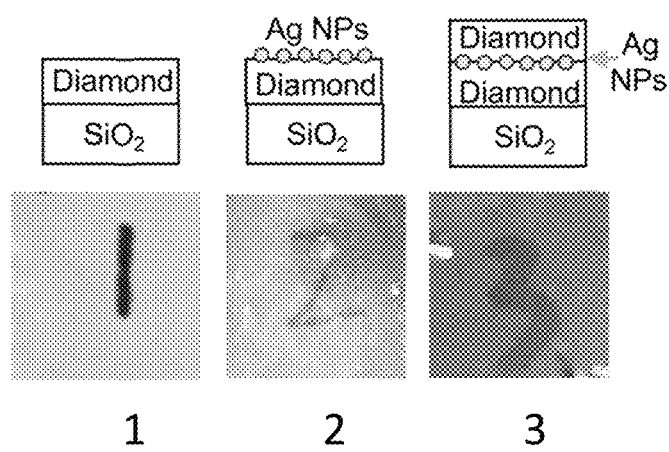
FIG. 14

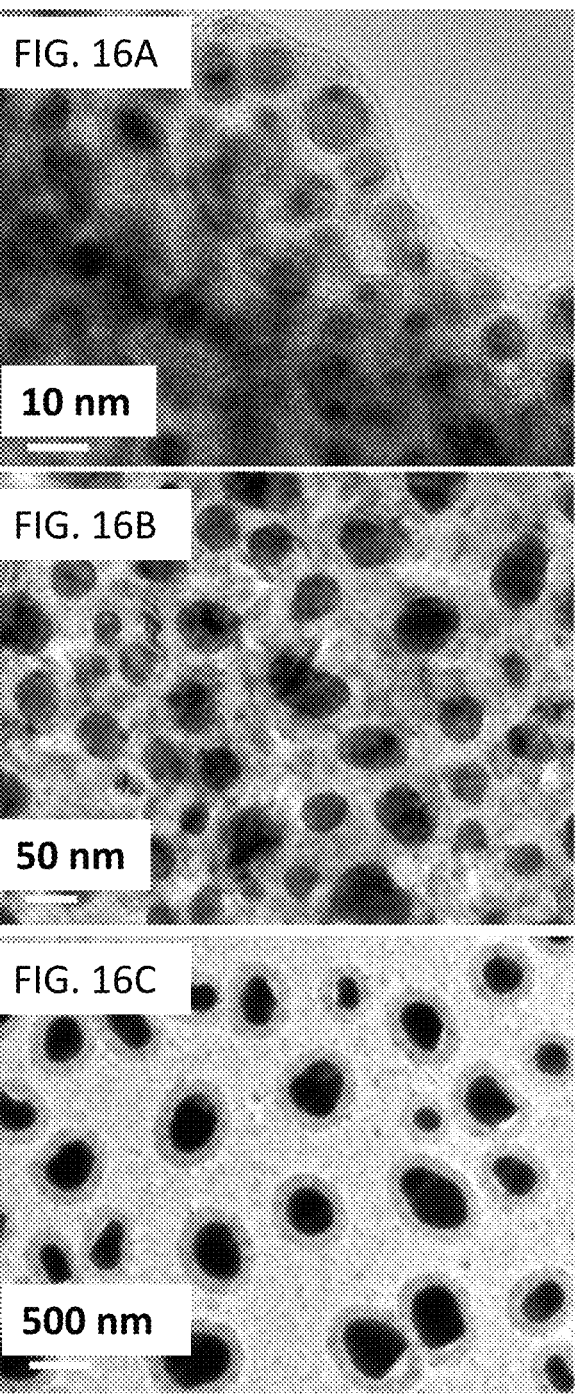

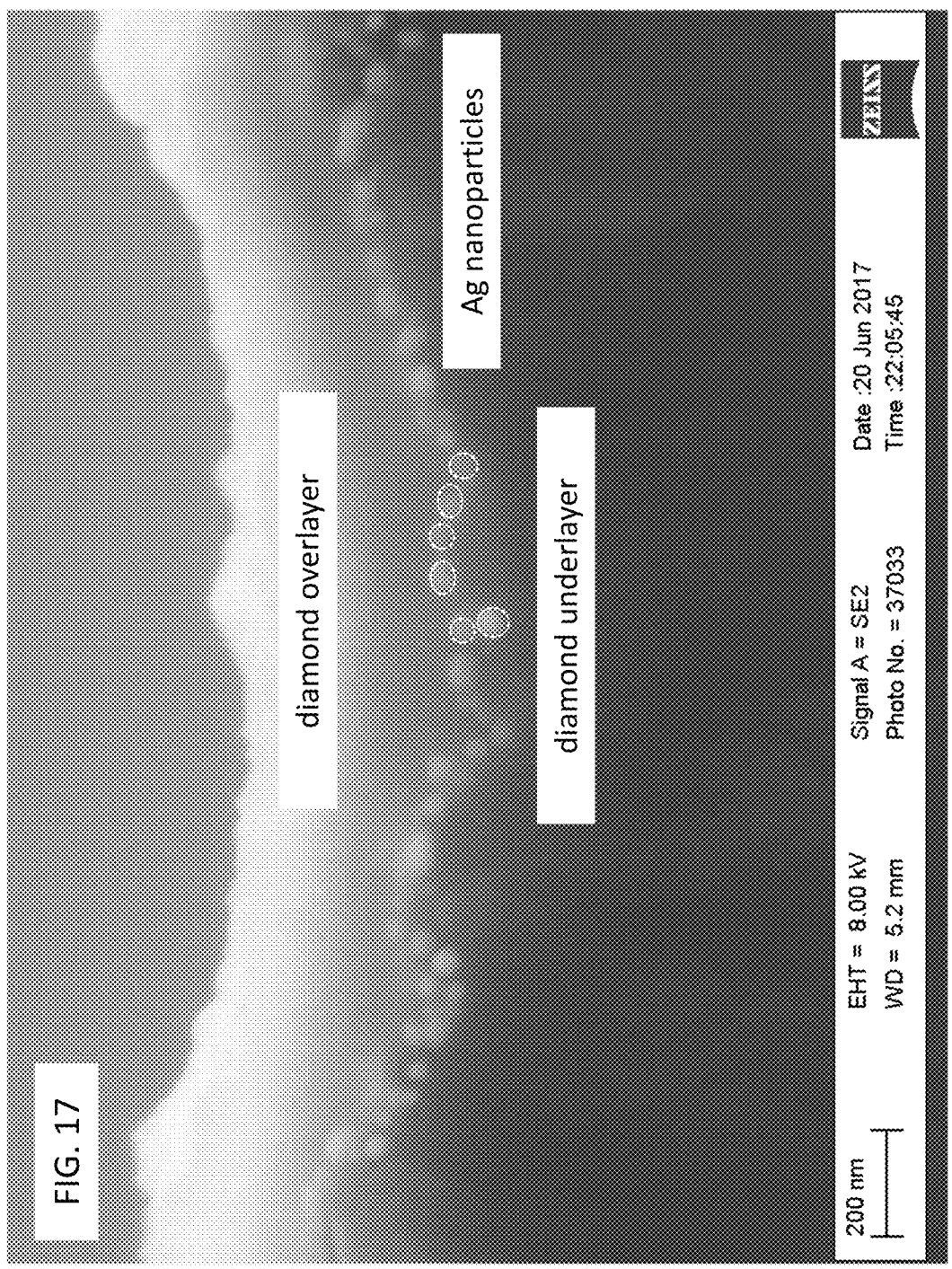

PLASMONIC DIAMOND FILMS AND RELATED METHODS

CROSS-REFERENCE TO RELATED APPLICATIONS

The present application claims priority to U.S. provisional patent application No. 62/554,713, filed on Sep. 6, 2017, the entire contents of which are hereby incorporated herein by reference.

REFERENCE TO GOVERNMENT RIGHTS

This invention was made with government support under 1507432 awarded by the National Science Foundation. The government has certain rights in the invention.

BACKGROUND

While photocatalytic chemical transformations at surfaces are typically limited by the intrinsic electrochemical stability of water, recent studies have demonstrated that diamond surfaces illuminated with ultraviolet light act as solid-state electron sources and are able to initiate chemical reactions that cannot be readily achieved using conventional photocatalysis, including photochemical synthesis of $NH_3$ from $N_2$ in water[1-4] and the selective one-electron reduction of $CO_2$ to CO.[5] A unique aspect of this approach is that instead of transferring electrons to reactants adsorbed onto the diamond surface, diamond directly emits electrons into the aqueous medium, creating species such as solvated electrons and neutral hydrogen atoms that initiate unusual homogeneous chemistry in solution.[1-2] The photocatalytic reduction of $N_2$ to form $NH_3$ is notable because of the very high barrier associated with formation of the critical intermediate $N_2H$,[6] and because of the poor adsorption of $N_2$ onto conventional photocatalytic surfaces.[7-9] Diamond surfaces are uniquely suited to emit electrons into water because diamond has a very high-lying conduction band (even higher than the vacuum level) and, when the surface is terminated with H-atoms, the resulting surface dipole facilitates electron emission by eliminating any barrier to electron emission. This combination of properties is referred to as negative electron affinity (NEA).[10-13] While photoemission from the vast majority of materials can only occur from the outer ~1 nm of the surface, in NEA materials such as diamond absorption deeper in the bulk can also produce electron emission, as electrons excited into the bulk conduction band can diffuse to the surface and be ejected into vacuum or, as studied here, an adjacent aqueous phase. While bulk absorption is an attractive way of initiating electron emission, it requires wavelengths of <225 nm to excite across the 5.5 eV bulk bandgap. Consequently, surface-initiated photoemission processes are also of interest for diamond. Prior studies have shown that surface-initiated photoemission from diamond into vacuum can be initiated at photon energies as low as 4.4 eV (282 nm wavelength) by excitation of valence-band electrons at the surface directly to free-electron states in vacuum. Water has a conduction band lying ~1.1 eV below the vacuum level;[14] consequently, transitions from diamond's valence band directly to conduction-band states of water are thermodynamically possible at photon energies as small as 3.3 eV (375 nm).[14-15]

Although diamond's electron emissive abilities are able to initiate novel chemistry, the overall efficiency of the bulk-initiated photoemission processes is limited in part by diamond's large bandgap (5.5 eV), thereby requiring deep ultraviolet light with wavelengths $\lambda$<225 nm to excite electrons from the valence band to the conduction band. Due to diamond being an indirect bandgap semiconductor, the bulk absorption coefficient is also relatively small even for photon energies above the bandgap (e.g., $3\times10^3$ cm$^{-1}$ at 213 nm).[16] Since electron diffusion lengths in polycrystalline diamond are only on the order of 1 μm,[17] many of the impinging photons are absorbed too deep in the bulk for the resulting conduction-band electrons to reach the surface before recombination.

SUMMARY

Provided are plasmonic diamond films and methods for making and using the plasmonic diamond films.

In one aspect, methods of forming plasmonic diamond films are provided. In an embodiment, such a method comprises forming a first layer of diamond on a substrate; depositing a layer of a metal on a surface of the first layer of diamond to form an as-deposited layer of metal; exposing the as-deposited layer of metal to a plasma treatment to convert the as-deposited layer of metal to a plurality of discrete regions of the metal on the surface of the first layer of diamond; and forming a second layer of diamond on the plurality of discrete regions of metal to form the plasmonic diamond film comprising a plurality of plasmonic nanoparticles.

In another aspect, plasmonic diamond films are provided. In an embodiment, a plasmonic diamond film comprises a plurality of plasmonic nanoparticles encapsulated by diamond and distributed on an underlying surface of diamond.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings.

In the figures below and throughout the present disclosure, in embodiments, "plasmonic diamond films" may also be referred to as "plasmonic structures," "sandwich structures," and "D-Ag-D."

FIGS. 2A-2C are top views of an identical region, with a 2 μm scale bar. FIG. 2A shows an SEM image acquired using 5 kV incident electron energy, showing primarily surface topography. FIG. 2B shows an SEM image of the same region, at 25 kV incident energy, now showing bright regions corresponding to buried Ag structures. FIG. 2C shows an EDS map showing the spatial distribution of Ag; dark coloration corresponds to high Ag X-ray emission. FIG. 2D shows a cross-sectional view of D-Ag-D sandwich structure. FIG. 2E shows Raman spectra of D-Ag-D and D-Si samples, showing characteristic 1332 cm$^{-1}$ diamond peak; the D-Ag-D spectrum was shifted vertically for clarity.

The spectra have not been shifted or otherwise modified. The feature at 240 nm arises from the direct bandgap of the underlying silicon substrate and is observed in all three samples.

Figure 4A:
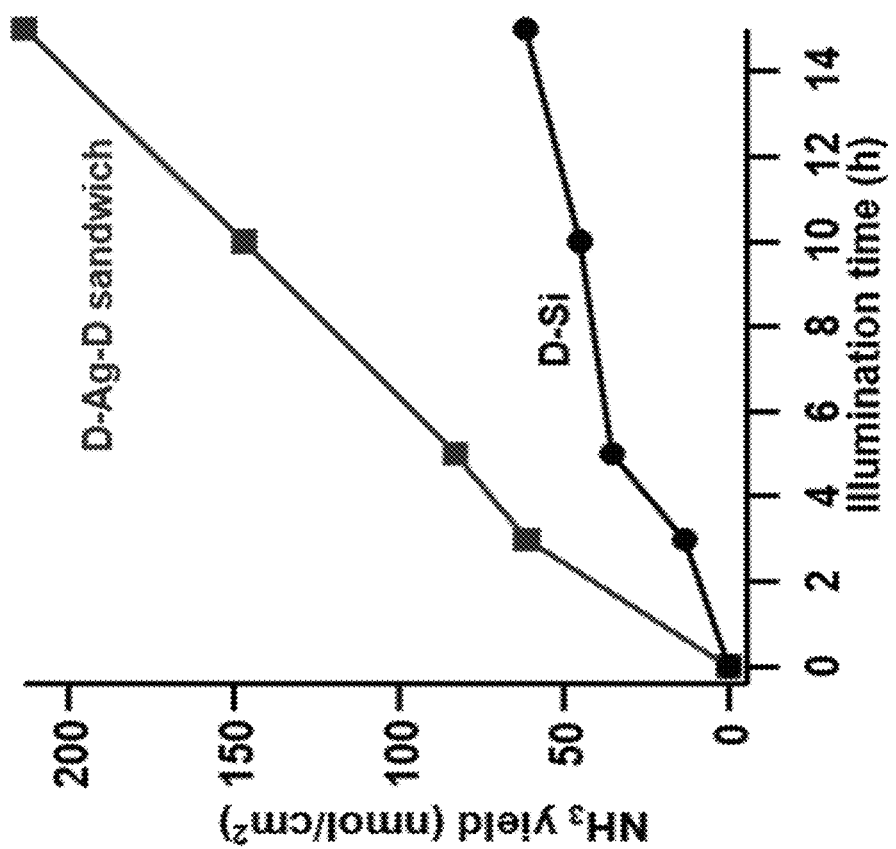
Figure 4B:
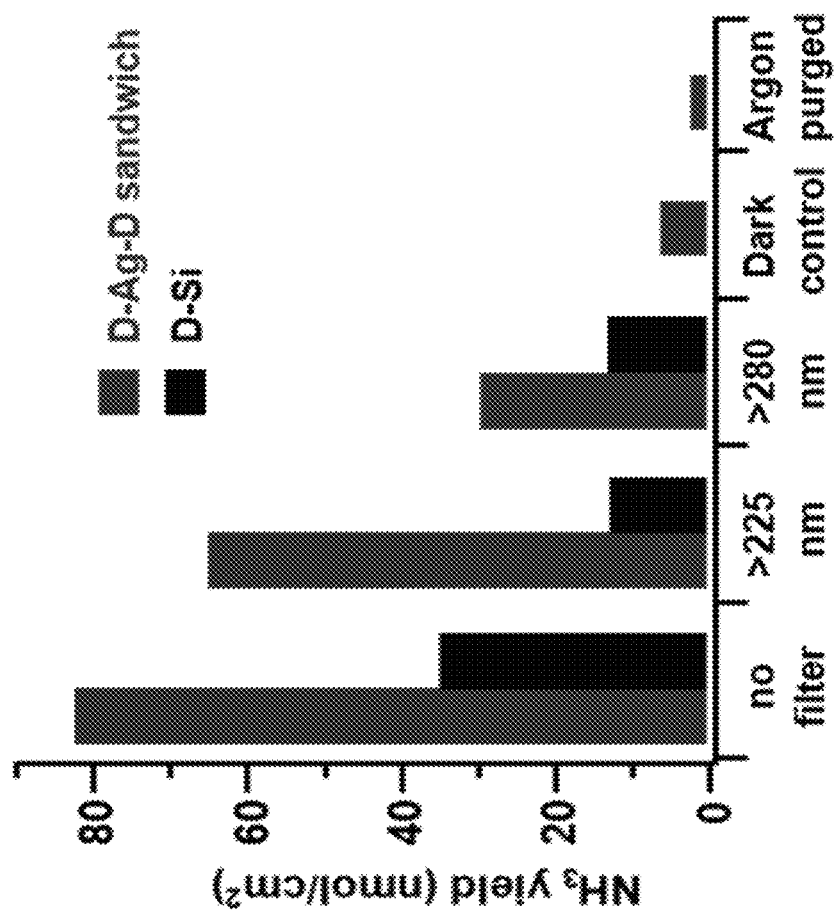

FIG. 4A shows the photocatalytic ammonia yield from D-Ag-D and D-Si samples for different illumination times. FIG. 4B shows the ammonia yield after 5 h illumination using selected wavelength regions for D-Ag-D (left bars) and D-Si (right bars) samples.

Figure 5:
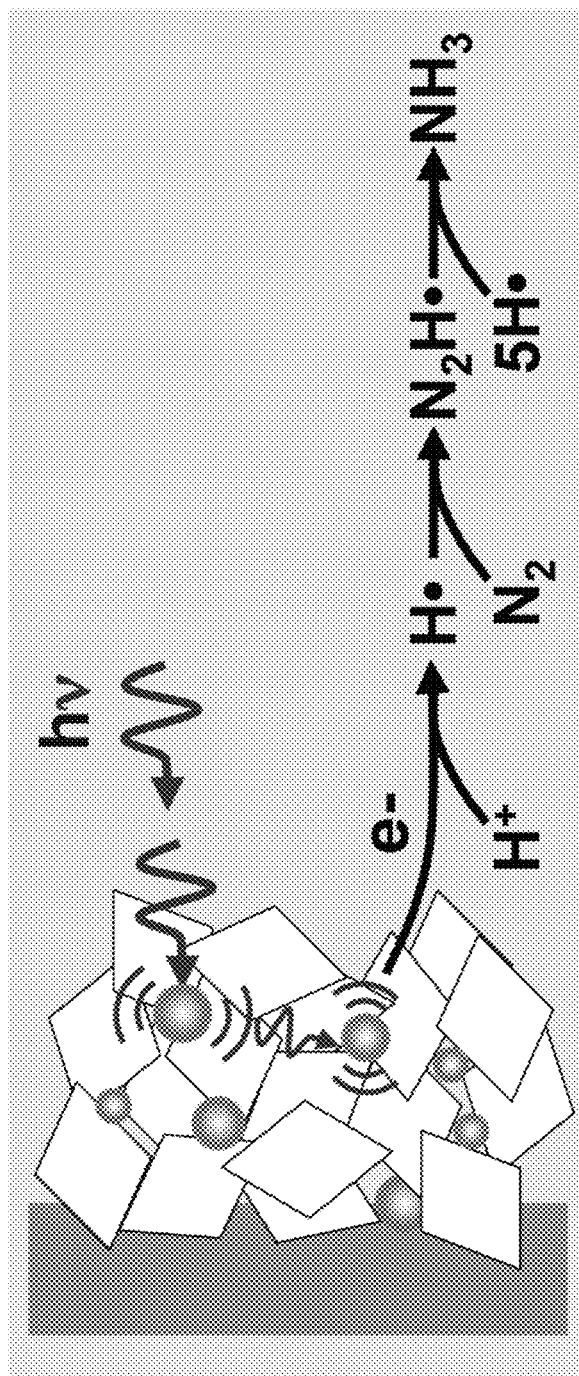

FIG. 5 schematically illustrates the use of a D-Ag-D sample in the solvated electron-initiated reduction of $N_2$ to $NH_3$ in water.

Figures 6A, 6B:
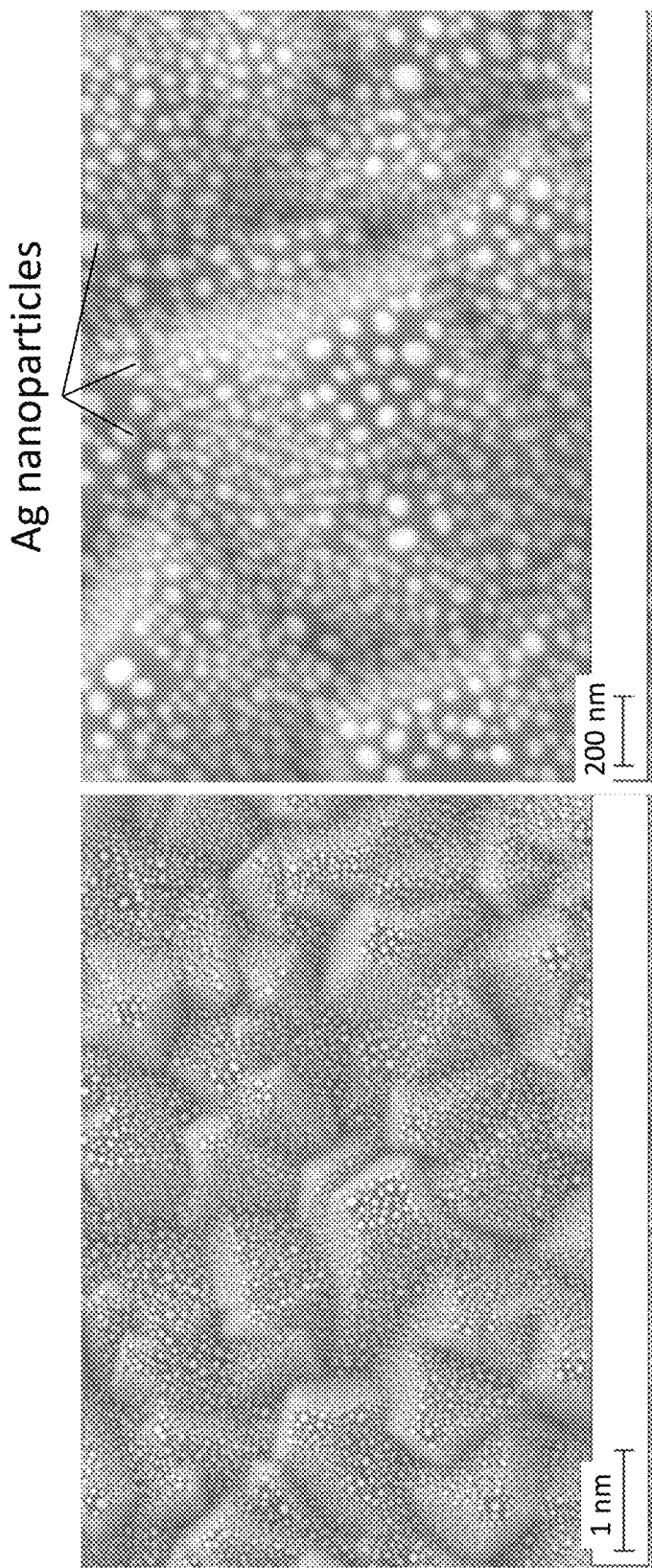

FIGS. 6A and 6B show top-view SEM images of a diamond-seeded Ag film (dewetted) after a plasma treatment.

Figure 7:
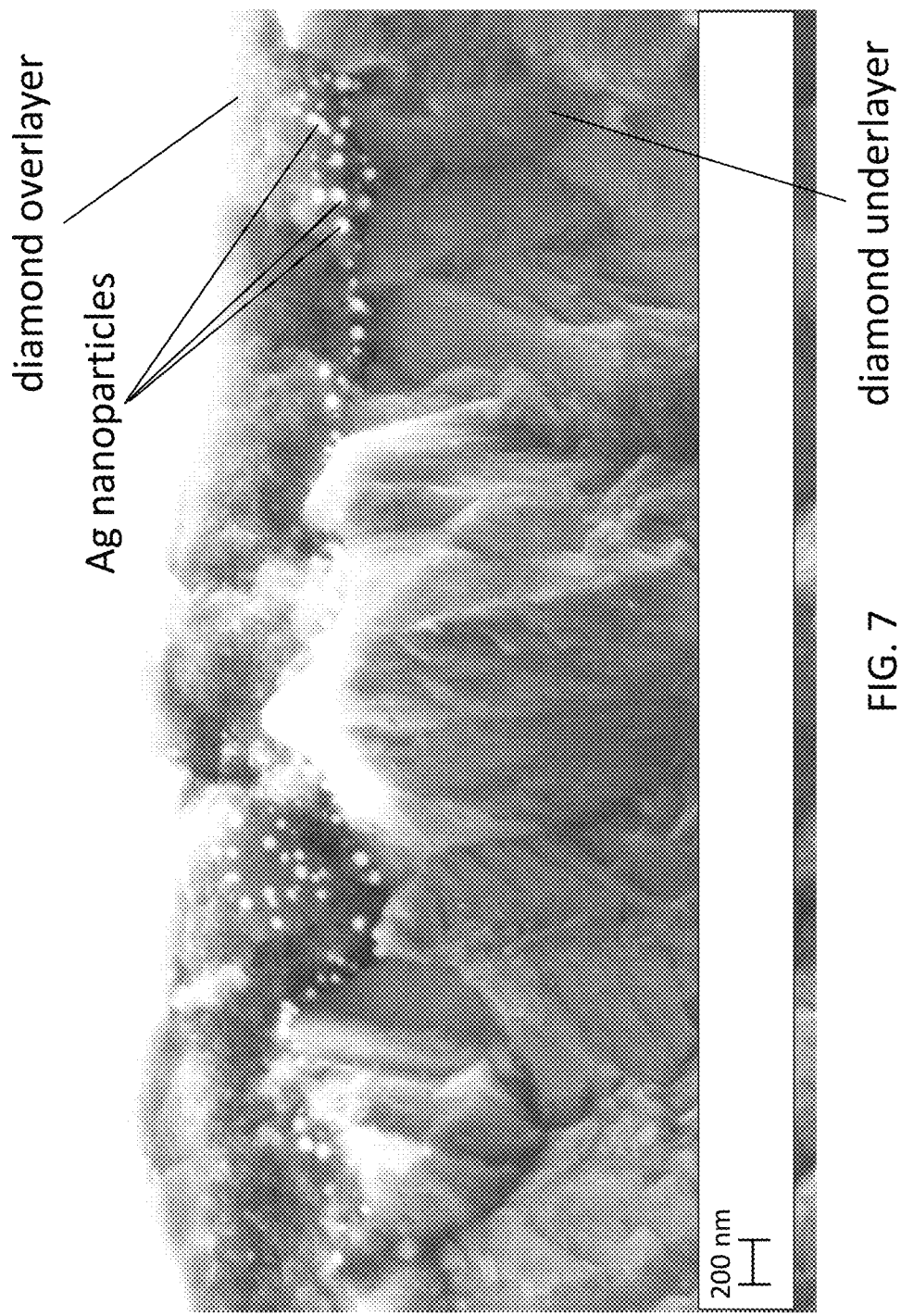

FIG. 7 shows a cross-sectional SEM image of a D-Ag-D structure made using a plasma treatment.

Figure 8B:
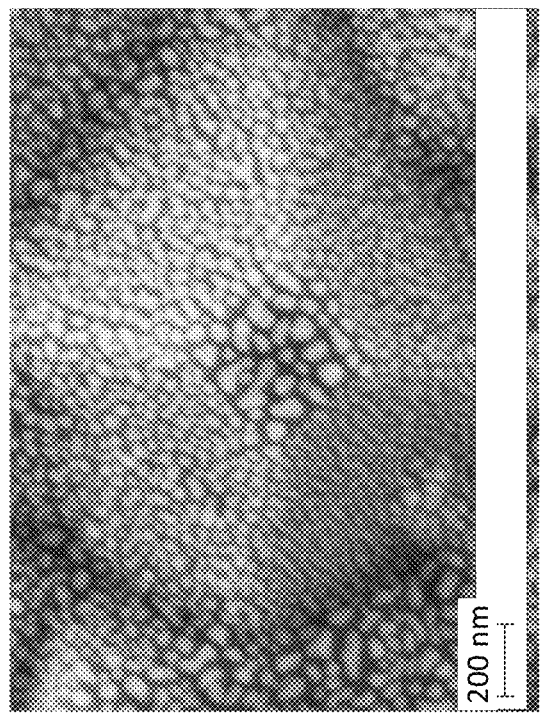
Figure 8A:
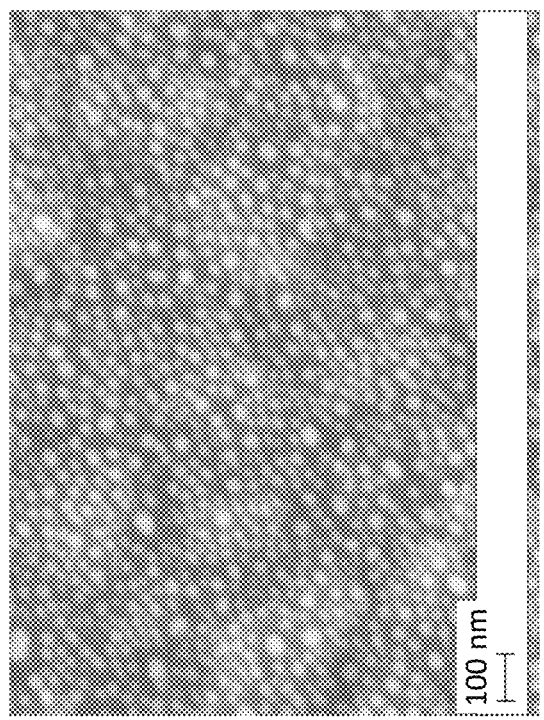
Figure 8D:
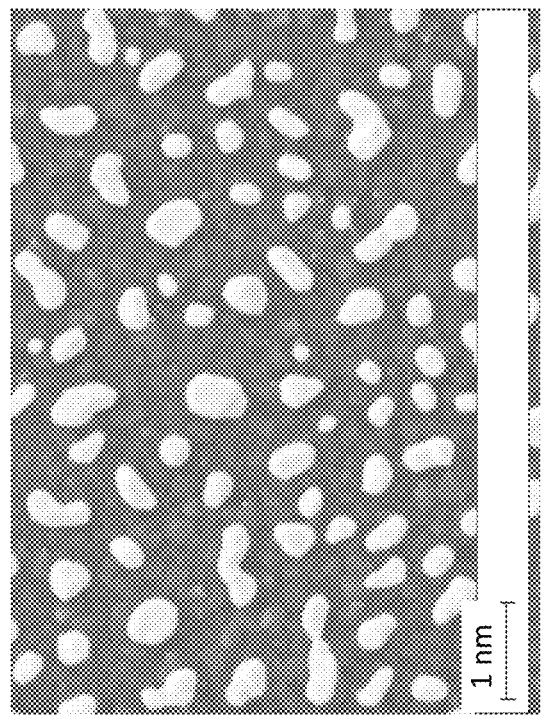
Figure 8C:
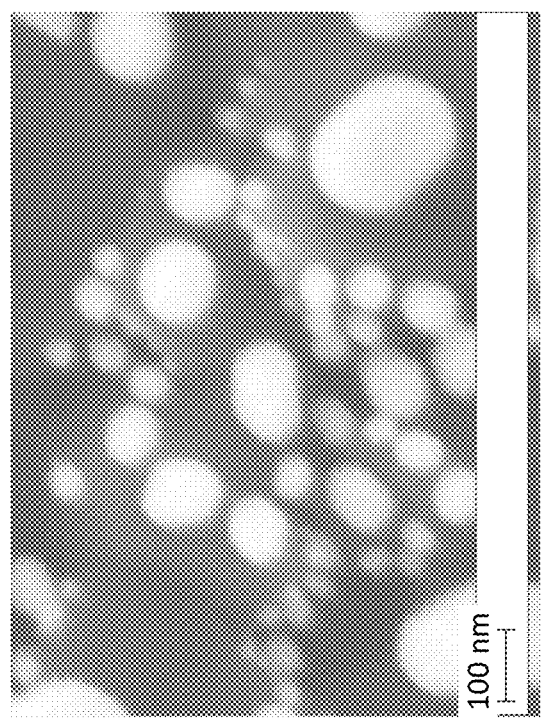

FIGS. 8A-8D show top-view SEM images of a diamond-seeded Ag film (dewetted) after a plasma treatment but using Ag films of different thicknesses to control the size of the resulting Ag nanoparticles: FIG. 8A (10 nm thick Ag layer); FIG. 8B (20 nm thick Ag layer); FIG. 8C (30 nm thick Ag layer); FIG. 8D (50 nm thick Ag layer).

Figure 9B:
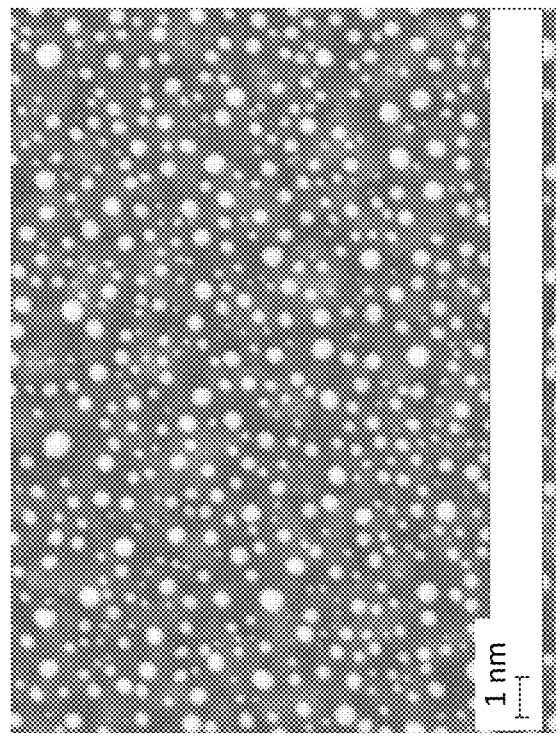
Figure 9A:
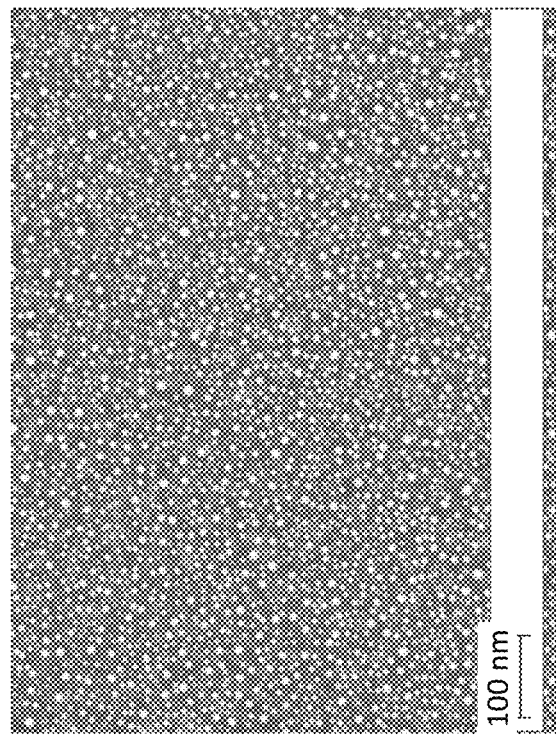

FIGS. 9A-9B show top-view SEM images of a diamond-seeded Ag film (dewetted) formed on a quartz substrate and using a plasma treatment.

Figure 10:
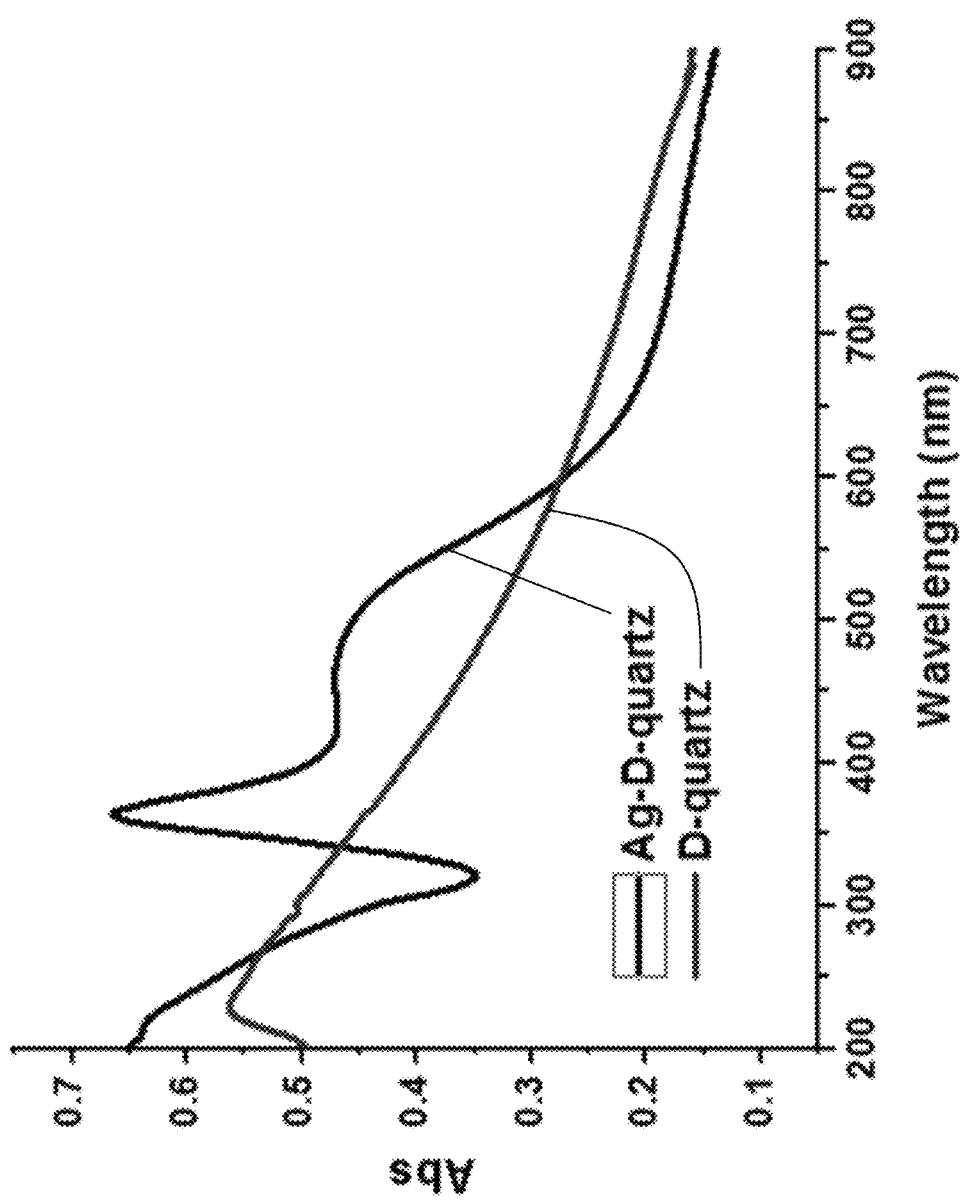

FIG. 10 shows a diffuse reflectance spectrum of the film of FIGS. 9A-9B.

Figure 11B:
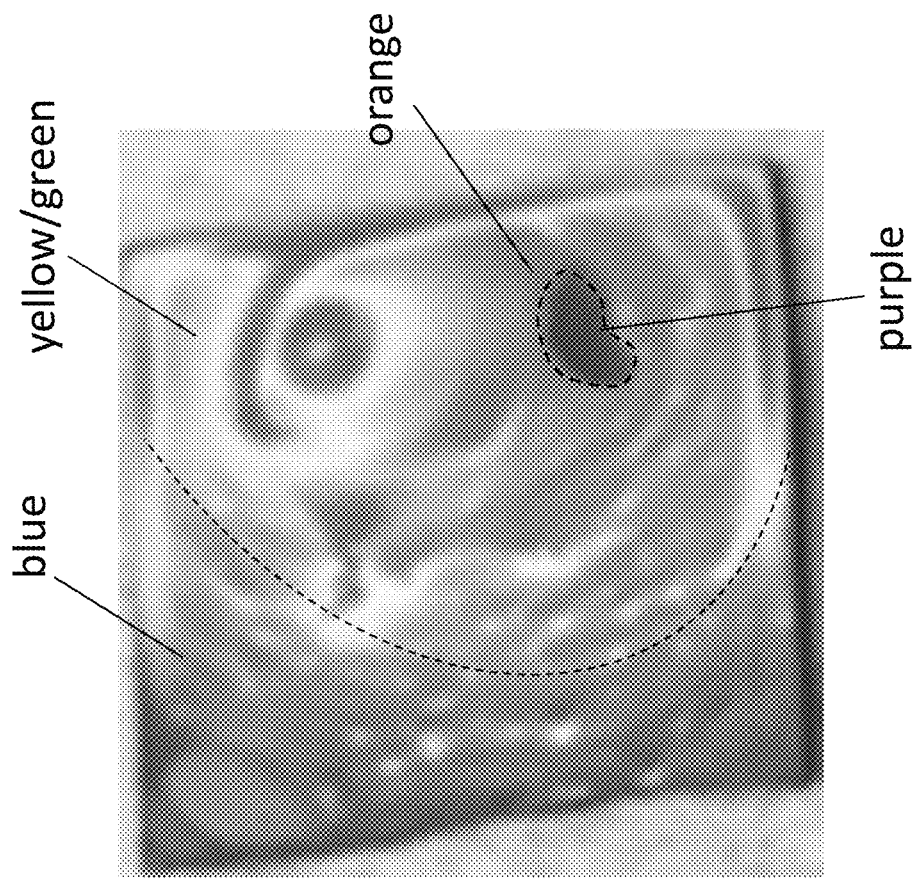
Figure 11A:
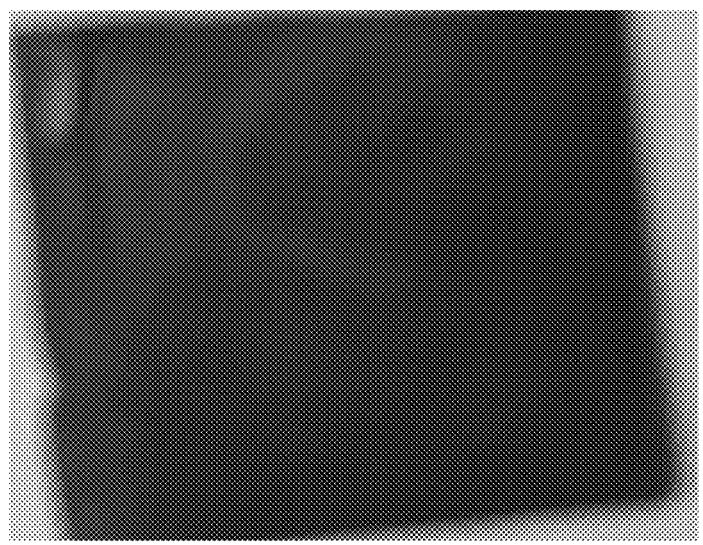

FIG. 11A shows a camera image of a diamond layer on silicon without embedded particles. FIG. 11B shows a camera image of a diamond layer on silicon with embedded Ag nanoparticles. FIG. 11B demonstrates the coloration of diamond possible using the embedded Ag nanoparticles as compared to the black film of FIG. 11A.

Figure 12:

FIG. 12 shows a top-view SEM image of commercially available Ag nanoparticles dispersed on a diamond layer.

Figure 13:
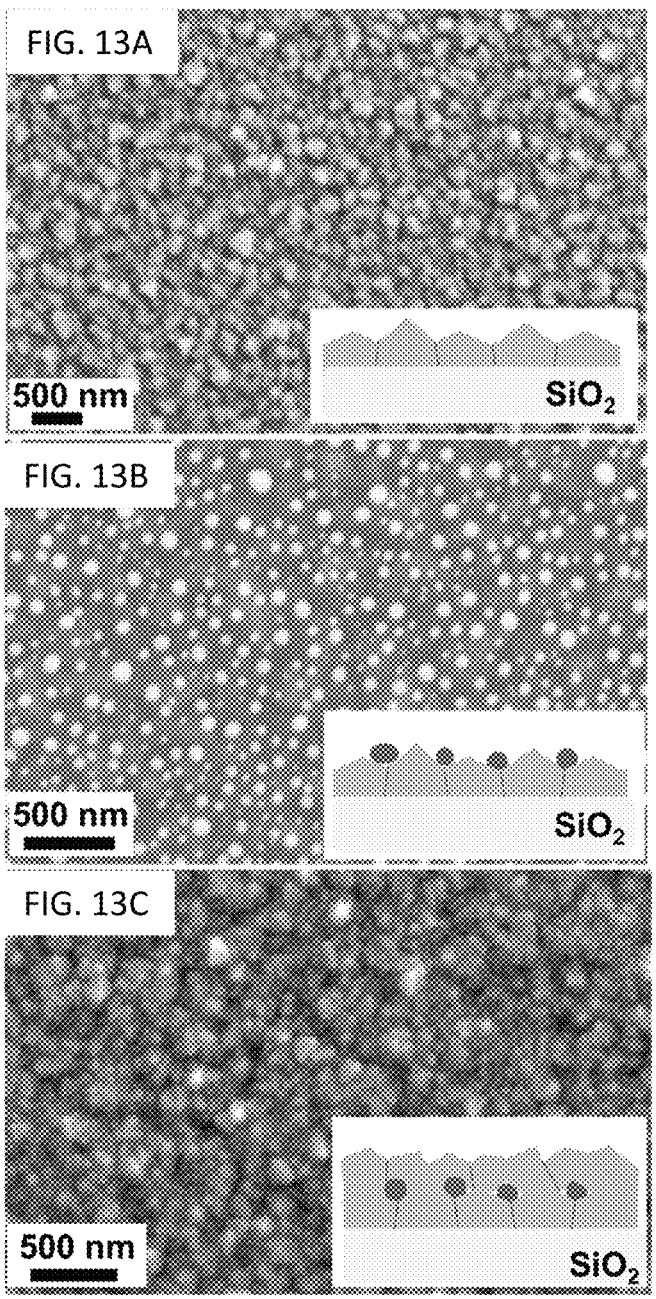

FIG. 13A-13C show top-view SEM images and schematic illustrations (insets) of diamond grown on $SiO_2$ (FIG. 13A), dewetted Ag nanoparticles on diamond/$SiO_2$ (FIG. 13B) and a film of Ag nanoparticles encapsulated by diamond and embedded therein (FIG. 13C).

FIG. 14 shows optical absorption spectra of (1) diamond on $SiO_2$, (2) Ag nanoparticles on diamond film after dewetting, and (3) Ag nanoparticles embedded in diamond film. The lower panel depicts the corresponding three stages of formation and includes visible-light photographs of the three samples held above a white background with the corresponding sample number written on the white background.

Figure 15:
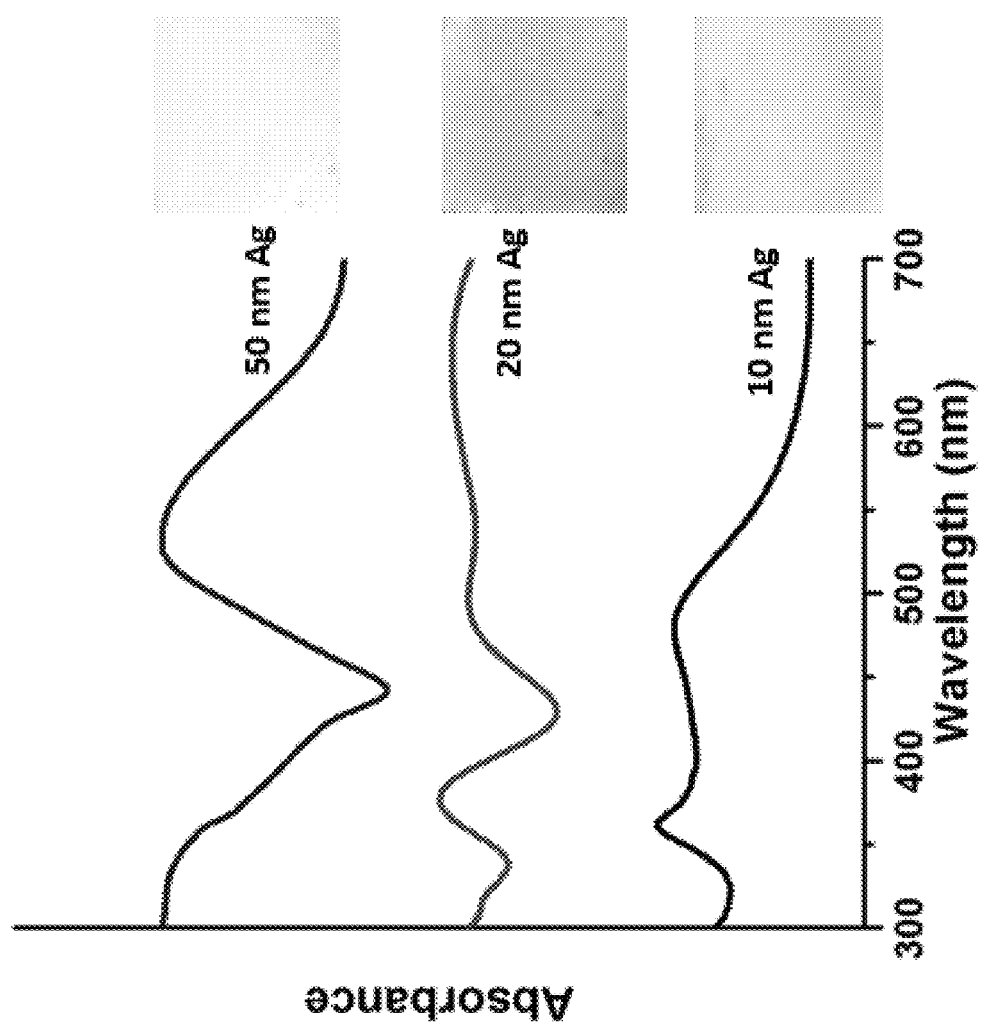

FIG. 15 shows UV-Vis spectra and corresponding white-light optical images of D-Ag-D on fused silica formed using 10, 20 and 50 nm initial Ag layer thicknesses.

FIGS. 16A-16C show TEM images of D-Ag-D samples prepared by from Ag layers of different thicknesses, after dewetting and growth of a second diamond layer for 15 minutes: 10 nm Ag thickness (FIG. 16A), 20 nm Ag thickness (FIG. 16B), and 50 nm Ag film thickness (FIG. 16C).

FIG. 17 shows a cross-sectional SEM image of a D-Ag-D structure made as described in Example 3. In this case the Ag nanoparticles are encapsulated and embedded within a continuous diamond matrix.

Figures 18A, 18B:
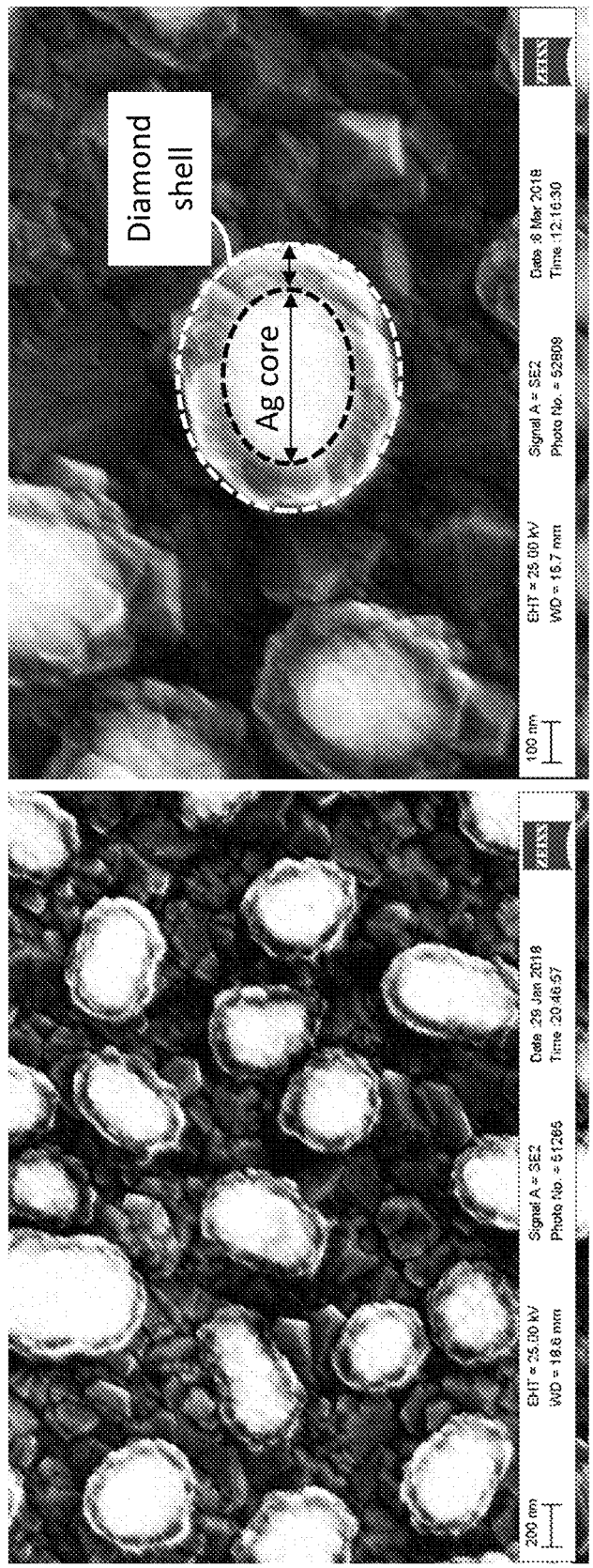

FIGS. 18A and 18B show top-view SEM images of D-Ag-D structures made as described in Example 3. However, in this case the Ag nanoparticles are encapsulated by diamond shells to form Ag-diamond core-shell structures. FIG. 18B includes a white dashed outline to indicate the outer surface of a diamond shell and a black dashed outline to indicate the outer surface of an Ag core. The arrows represent the shell thickness and core diameter, respectively.

Figure 19:
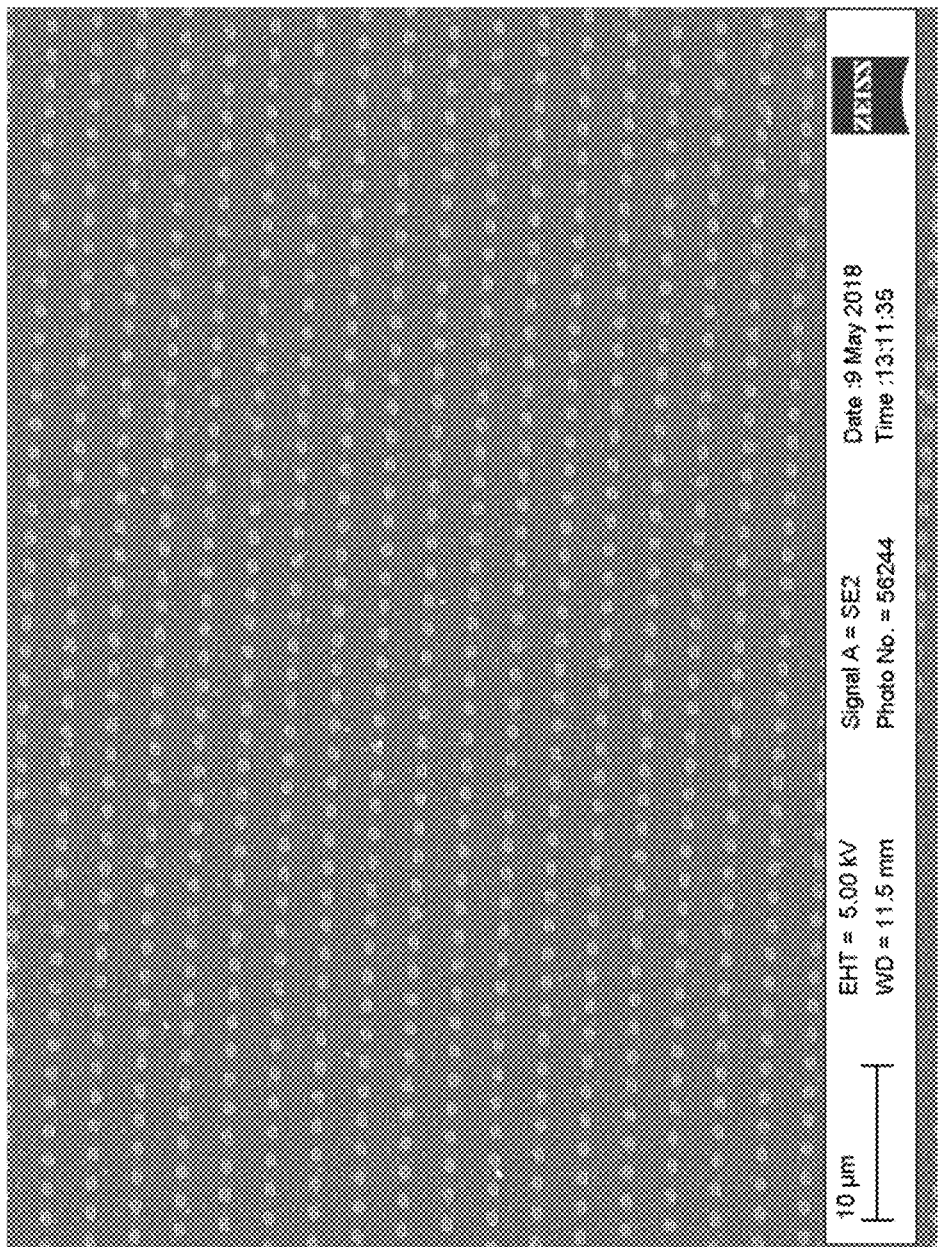

FIG. 19 illustrates the use of electron beam patterning to deposit an Ag layer on the surface of a first diamond layer.

DETAILED DESCRIPTION

Provided are plasmonic diamond films and methods for making and using the plasmonic diamond films. In the plasmonic diamond films, the optical properties of diamond are adjusted by integrating plasmonic nanoparticles therein. In embodiments, the adjustment includes enhancing optical absorption, thereby improving the efficiency of the diamond as a solid-state electron source. A significant challenge in integrating plasmonic nanoparticles into diamond (as opposed to other dielectric media) is that formation of high-quality diamond films typically involves high temperatures (>700° C.) at the the active growth surface. Plasmonic nanoparticles can also couple directly to a microwave field, producing additional local heating effects. Consequently, most metals (from which plasmonic nanoparticles are formed) react to form metal carbides under the conditions needed for diamond growth. In addition at such high temperatures, diffusion and Ostwald ripening of the metal are expected to occur.[28-29] Such mechanisms have been thought to frustrate the formation of discrete nanoparticles having a uniform shape, size and distribution in the diamond matrix. The present invention is based, at least in part, on addressing these challenges.

Fabrication Methods

Figure 1:
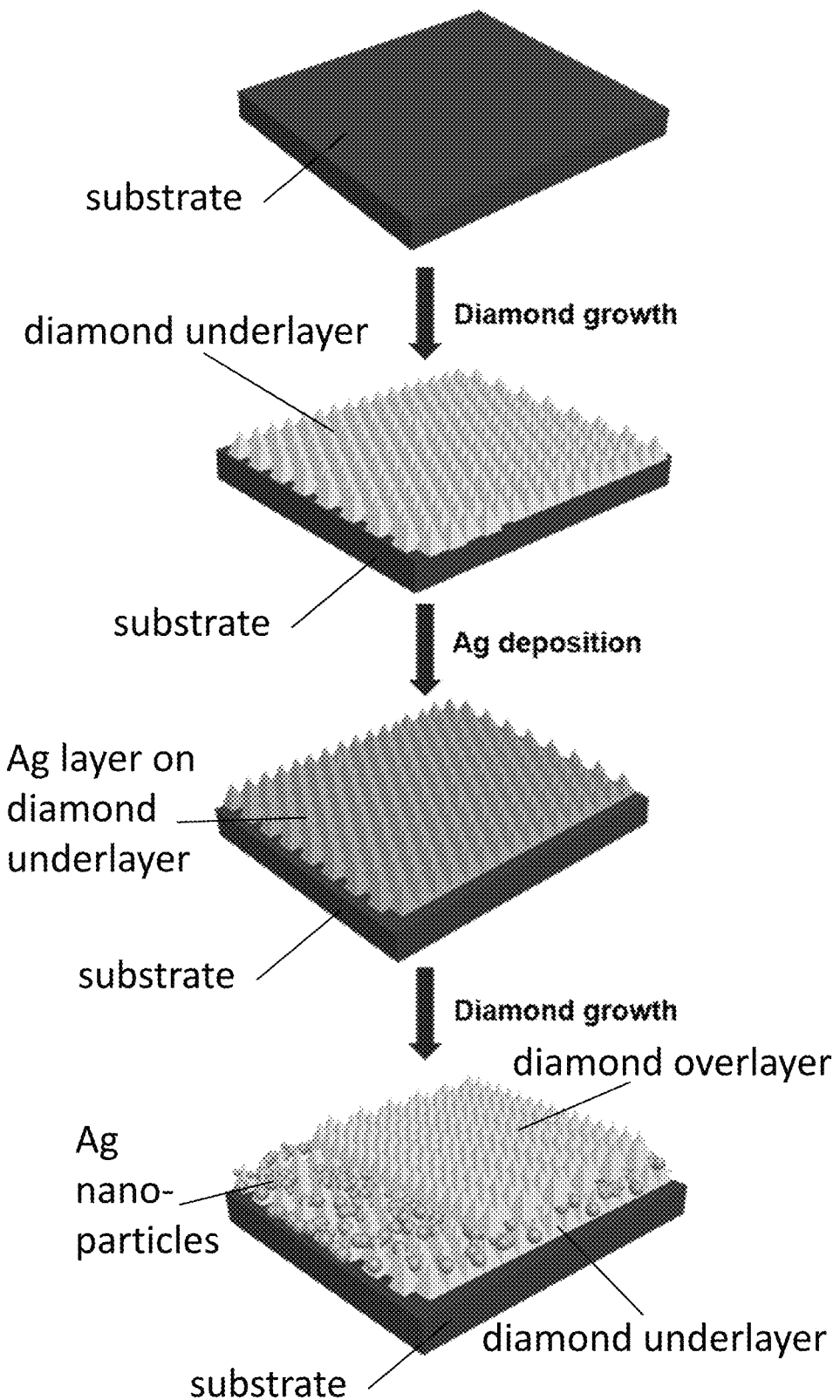
FIG. 1 illustrates the growth mechanism of D-Ag-D (diamond-silver-diamond) plasmonic structure according to an illustrative embodiment. After the first diamond growth, a thin Ag film is deposited; subsequent diamond growth forms Ag nanoparticles that are encapsulated by the growing diamond film.

In one aspect, methods of forming plasmonic diamond films are provided. In an embodiment, such a method comprises as an initial step, forming a first layer of diamond on the surface of a substrate. In embodiments, the phrase "on the surface" means "directly on the surface." This is schematically illustrated in FIG. 1. Formation of the first layer of diamond may be carried out by seeding the surface of the substrate with diamond (e.g., diamond powder) followed by nucleation and growth of diamond via microwave plasma enhanced chemical vapor deposition (PECVD). Illustrative conditions for seeding by sonication or spin-coating and nucleation/growth (e.g., flow rate of $H_2/CH_4$, power (which determines growth temperature), pressure, growth time) are provided in the Examples, below. The growth temperature may be at least 400° C., at least 500° C., at least 600° C., at least 700° C., at least 800° C., or in the range of from 400° C. to 900° C.

The first layer of diamond may be characterized by a thickness. The thickness may be an average thickness by which it is meant an average value of thicknesses measured from a representative number of locations across the surface of the first layer of diamond. The thickness may be controlled by the growth time. In embodiments, the average thickness is in the range of from 900 nm to 1200 nm. These average thicknesses may be achieved using a growth time of 3 hours. Average thicknesses may be measured from cross-sectional SEM images. The first layer of diamond may be characterized as being a continuous layer. By "continuous layer" it is meant an unbroken coating, although to the inherent nature of the diamond formation technique, there may be a small number of imperfections (i.e., disruptions) in the coating. Continuous first layers of diamond are shown in FIG. 2D (bottom diamond layer), FIG. 7 ("diamond underlayer") and FIG. 17 ("diamond underlayer").

Other techniques may be used for forming the first layer of diamond, including hot-filament synthesis and low-temperature plasma-enhanced chemical vapor deposition.

In the present disclosure, the term "diamond" refers to carbon materials, wherein the carbon atoms are primarily $sp^3$ hybridized, and includes species of diamond having varying degrees of crystallinity. Suitable carbon materials having $sp^3$ hybridization≥50% include microcrystalline diamond, nanocrystalline diamond, ultrananocrystalline diamond and diamond-like materials, such as tetrahedral amorphous carbon (ta-C). Microcrystalline diamond, nanocrystalline diamond, ultrananocrystalline diamond are different types of polycrystalline diamond having different crystal sizes, the sizes controllable via adjustments to the growth temperature, ratio of $CH_4/H_2$, and power. "Diamond" is distinguished from graphic carbon in which the carbon atoms are $sp^2$ hybridized. Diamond is further distinguished from "diamond-like carbon" which is a non-crystalline form of carbon composed primarily of amorphous materials lacking a long-range crystal structure. (Also see the International Union of Pure and Applied Chemistry (IUPAC) definition of "diamond-like carbon".) The diamond of the present plasmonic diamond films may be characterized by a ratio of $sp^3:sp^2$ hybridization, which may be determined using Raman spectroscopy. In embodiments, the ratio is at least 50:1. The diamond may be undoped or doped (with p-type dopants such as boron (B) or with n-type dopants such as phosphorous (P) or nitrogen (N)).

After formation of the first layer of diamond, a layer of metal is deposited thereon. Deposition of the layer of a metal on the surface of the first layer of diamond may be carried out using a variety of thin film deposition techniques, including electron-beam evaporation and thermal evaporation. A variety of metals may be used, provided the metal does not form stable carbides at the temperature used to form the diamond layers. In embodiments, the metal is one which does not form stable carbides at a temperature of in the range of from 400° C. to 900° C., 500° C. to 900° C., or 700° C. to 900° C. By "no carbides" it is meant that the carbide formation is zero or sufficiently close to zero so as not to materially affect the properties of the plasmonic diamond film.

The metal is also one which, when forming an interface with a dielectric medium (e.g., diamond), is capable of coupling with electromagnetic radiation to excite surface plasmons at the metal-dielectric interface. When such a metal is in the form of nanoparticles, the metal nanoparticles are capable of coupling with electromagnetic radiation of wavelengths larger than the size of the nanoparticles. Such nanoparticles may be referred to as plasmonic nanoparticles. The metal may be selected depending upon the range of electromagnetic radiation to be coupled. By way of illustration, the electromagnetic radiation to be coupled may include radiation in the visible portion of the electromagnetic spectrum (e.g., light having wavelengths from 400 nm to 700 nm), radiation in the ultraviolet portion of the electromagnetic spectrum (e.g., light having wavelengths from 150 nm to 400 nm), etc.

Illustrative metals include copper (Cu), silver (Ag), gold (Au), platinum (Pt), aluminum (Al), cobalt (Co), nickel (Ni) and palladium (Pd). Combinations of different metals may be used. In embodiments, the metal is a relatively low melting point metal such as Ag, Au, Cu, or Al. Among these metals, Ag stands out because Ag nanoparticles with diameters less than ~60 nm have strong plasmonic effects in visible and ultraviolet regions.[21, 25, 30-31] and because the Ag—C phase diagram shows that silver does not form any stable carbide phases in the temperature range of interest,[32] showing that it is possible to form an abrupt diamond-Ag interface.

The as-deposited layer of metal may be characterized as being a continuous layer formed on the surface of the underlying first layer of diamond. The phrase "continuous layer" has a meaning analogous to that described above with respect to the first layer of diamond. However, at elevated temperatures (e.g., greater than 400° C.), the layer of metal can spontaneously "dewet" from the surface of the first layer of diamond to form a plurality of discrete regions of metal, the discrete regions of metal separated by regions of bare (i.e., uncoated) diamond. In this case, the term "continuous" also distinguishes the as-deposited layer of metal from the plurality of discrete regions of metal that form due to dewetting. These discrete regions of metal ultimately form the plasmonic metal nanoparticles in the plasmonic diamond film.

Prior to dewetting, the as-deposited layer of metal may be characterized by a thickness. The thickness may be an average thickness as described above with respect to the first layer of diamond. The thickness may be controlled by the deposition rate and deposition time. As further described below, the thickness determines the size of the resulting plasmonic nanoparticles. In particular, thicker layers provide larger plasmonic nanoparticles while thinner layers provide smaller plasmonic nanoparticles. This is useful for tuning the optical properties of the plasmonic diamond film. Although the thickness is not particularly limited, in embodiments, the average thickness is no more than 10 nm, no more than 20 nm, no more than 30 nm, no more than 50 nm, or no more than 100 nm. This includes embodiments in which the average thickness is in the range of from 1 nm to 100 nm.

After formation of the layer of metal, a second layer of diamond is formed thereon. The second layer of diamond may be formed on the dewetted layer of metal, e.g., as opposed to the continuous layer of metal. Formation of the second layer of diamond may be carried out as described above with respect to the first layer, although the conditions (e.g. growth time) may be different from those used for the first layer of diamond. In embodiments, the layer of metal may be seeded with diamond prior to dewetting and prior to nucleation/growth of diamond.

As illustrated in FIG. 1 for plasmonic diamond films comprising plasmonic nanoparticles, in embodiments, the second layer of diamond forms a relatively thick coating which encapsulates the discrete regions of metal between the first and second layers of diamond to form plasmonic nanoparticles embedded within a continuous diamond matrix. Again, "continuous" has a meaning analogous to that described above with respect to the first layer of diamond. In such embodiments, the second layer of diamond may also be characterized by an thickness as described above with respect to the first layer of diamond. In this case, however, the thickness is measured from the top surface of the first layer of diamond to the top surface of the second layer of diamond.

Illustrative plasmonic diamond films in which plasmonic nanoparticles (in these embodiments, Ag plasmonic nanoparticles) are embedded within a continuous diamond matrix are shown in FIGS. 2D, 7 and 17. These are also further described below. It is surprising that the silver plasmonic nanoparticles shown in these figures were able to be encapsulated and embedded within a diamond matrix without significant aggregation or ripening of the Ag which would have otherwise been expected to be problematic, e.g., as compared to a much higher melting temperature metal.

In other embodiments, the second layer of diamond forms shells, each shell which encapsulates an individual discrete region of metal, to form a plurality of discrete core-shell plasmonic nanoparticles on the first layer of diamond. In such embodiments, there may also be diamond which forms between the discrete core-shell plasmonic nanoparticles on the surface of the first layer of diamond. However, in other embodiments, the underlying first layer of diamond remains uncoated/bare between the discrete core-shell plasmonic nanoparticles. By uncoated/bare it is meant that the underlying first layer of diamond has no additional diamond thereon or that the amount is too small to provide a layer with a measurable thickness. In each of these embodiments, the second layer of diamond may also be characterized by a thickness. However, in this case, the thickness may refer to the thickness of the shells as measured from a top surface of each shell to a top surface of the corresponding metal nanoparticle (as measured from a representative number of core-shell plasmonic nanoparticles). (See the black arrow marking the distance between the white and black dotted lines in FIG. 18B.) Shell thicknesses may be at least 20 nm, at least 40 nm, at least 60 nm, at least 80 nm, or in the range of from 20 nm to 100 nm.

Illustrative plasmonic diamond films in which core-shell plasmonic nanoparticles (in these embodiments, Ag-diamond core-shell plasmonic nanoparticles) are distributed across the surface of a diamond underlayer are shown in FIGS. 16C, 18A, and 18B. These are also further described below. It is surprising that the second layer of diamond forms shells encapsulating individual silver nanoparticles since it would have otherwise been expected that diamond would form initially on the underlying first layer of diamond and avoid growth on the "foreign" metal material.

As further described in Example 3, below, it has also been found that formation of core-shell plasmonic nanoparticles depends upon both the thickness of the layer of metal and the growth time of the second layer of diamond. In particular, core-shell plasmonic nanoparticles may be formed from relatively thick metal layers provided the growth time of the second layer of diamond is sufficiently long to form a shell but sufficiently short to avoid the formation of a continuous diamond matrix (see FIG. 16C in which the Ag layer was 50 nm and the growth time was 15 minutes). By contrast, when using relatively thin metal layers (see FIGS. 16A and 16B using 10 nm and 20 nm Ag layers, respectively) the growth time of the second layer of diamond must be decreased in order to achieve core-shell plasmonic nanoparticles instead of the continuous diamond matrix shown in these figures.

In embodiments, the method further comprises exposing the layer of metal to a plasma treatment prior to formation of the second layer of diamond thereon. The plasma treatment may be applied after seeding the layer of metal with diamond but prior to nucleation/growth of the second layer of diamond. However, in other embodiments, the layer of metal is seeded with diamond after the plasma treatment. The plasma treatment may be applied prior to dewetting of the layer of metal, i.e., to the as-deposited layer of metal.

The plasma treatment for the layer of metal may be carried out using a selected gas or gas mixture, e.g., $H_2$, $O_2$, etc. The plasma treatment may be carried out using a microwave source at a selected power for a selected time. The power is selected to prevent or minimize metal diffusion/aggregation during the dewetting process while also minimizing heating. Without wishing to be bound to any particular theory, it is thought that the plasma treatment may modify the surface chemistry of the layer of metal (e.g., with oxygen or hydrogen) in such a way as to prevent/minimize metal diffusion/aggregation. As further described below, this can provide plasmonic nanoparticles having a substantially uniform shape, size and distribution at the interface between the first and second layers of diamond. In embodiments, the power is no more than 600 W, 700 W, 800 W, etc. These powers may be referenced with respect to the surface area of the plasmonic diamond film being formed, e.g., a surface area of about 3 square inches (for a ~1 inch diameter film). The period of time over which the plasma treatment occurs may also be selected to minimize heating. In embodiments, the time is no more than 30 minutes, 10 minutes, 1 minute, etc.

One or more plasma treatments may be used in treating the layer of metal. Multiple plasma treatments may be characterized by different parameters. By way of illustration, a first plasma treatment may use $O_2$, followed by a second plasma treatment using $H_2$.

Various substrates may be used provided they are compatible with the conditions used for formation of the diamond layers and the deposition of the metal layer. Illustrative substrates include silicon and quartz.

As noted above, illustrative plasmonic diamond films formed as described in Examples 1 and 2, below are shown in FIGS. 2D and 7. Another illustrative plasmonic diamond film formed as described in Example 3, below, is shown in FIG. 17. These figures show cross-sectional scanning electron microscope (SEM) images. The plasmonic nanoparticles (in this case Ag plasmonic nanoparticles) are completely surrounded by, i.e., encapsulated, and embedded within, a continuous diamond matrix provided by the first and second diamond layers. (In FIG. 17, a few of the Ag plasmonic nanoparticles are indicated with white dashed lines.) Since the plasmonic nanoparticles were formed from the layer of metal deposited on the surface of the first layer of diamond, the resulting plasmonic nanoparticles are generally confined to the planar interface between the first and second layers of diamond, providing a "sandwich structure." By "planar" it is meant that on a macroscale, the plasmonic nanoparticles are characterized as being dispersed within a two-dimensional plane, although there are variations on the nanometer scale due to the inherent topography of the underlying first layer of diamond. The figures show there are no Ag nanoparticles on the surface of the second layer of diamond or outside of the planar interface between the first and second layers of diamond.

As noted above, an illustrative plasmonic diamond films formed as described in Example 3, below, are shown in FIGS. 16C, 18A and 18B. These figures show top-view transmission electron microscope (TEM) images. The plasmonic nanoparticles (in this case Ag plasmonic nanoparticles) are completely surrounded by, i.e., encapsulated, diamond shells provided by the second diamond layer. Again, the resulting core-shell plasmonic nanoparticles are generally confined to a plane, i.e., the surface of the first layer diamond.

The steps of the methods of forming the plasmonic diamond films described above may be repeated to form multi-layer plasmonic diamond structures, e.g., D-Ag-D-Ag-D-Ag-D . . . structures. In such multi-layer plasmonic diamond structures, the steps may be tuned so that the plasmonic nanoparticles in different layers either have the same features (e.g., same size, all embedded in a continuous diamond matrix, all core-shell structures, etc.) or different features.

Finally, the methods of forming the plasmonic diamond films described above may incorporate patterning techniques, e.g., to deposit the layer of metal as a patterned layer. This is illustrated in FIG. 19. In this case, the Ag layer was patterned as a matrix of rectangular regions. In each rectangular region, the Ag coating is continuous ("continuous" as a meaning analogous to that described above). Upon plasma treatment, the Ag in each rectangular region dewets into one or more Ag nanoparticles (the number of Ag nanoparticles depending upon the lateral dimension of the rectangular region). Upon formation of a second diamond layer, the Ag nanoparticles in each rectangular region become encapsulated by diamond, either in the form of a continuous diamond matrix or shells over each individual Ag nanoparticle (depending upon the growth time of the second diamond layer).

Plasmonic Diamond Films

As noted above, in embodiments, a plasmonic diamond film comprises a plurality of plasmonic nanoparticles embedded within a continuous diamond matrix. As described above, the plurality of plasmonic nanoparticles may form a planar layer positioned between, and extending substantially parallel to, the top surface of the diamond matrix and the bottom surface of the diamond matrix. Similarly, the diamond matrix may be composed of a first layer of diamond and a second layer of diamond, wherein the plurality of plasmonic nanoparticles are positioned at the interface of the first and second layers of diamond. The overall average thickness of the plasmonic diamond film may correspond to the sum of the average thicknesses of the first and second layers of diamond. Similarly, the crystallinity of the diamond matrix may correspond to the crystallinity of the respective first and second layers of diamond. In embodiments, the crystallinity of the second layer of diamond is different from the crystallinity of the first layer of diamond (e.g., as determined by the size of the crystallites, facet shape of crystallites, etc.). This is possible even if substantially the same conditions are used to form the two layers of diamond due to the differences in growth substrates (i.e., the substrate on which the first layer of diamond is grown versus the layer of metal on which the second layer of diamond is grown).

In other embodiments, the plasmonic diamond films comprise a plurality of metal core-diamond shell plasmonic nanoparticles distributed across an underlying surface of diamond. Additional diamond may be formed on the underlying surface of diamond between individual core-shell plasmonic nanoparticles. This type of plasmonic diamond film may be characterized by the thickness of the diamond shells (as described above) as well as the thickness of the underlying diamond (as described above). The crystallinity of the diamond shells may be the same or different from the crystallinity of the underlying diamond. In embodiments, the diamond shells are polycrystalline.

Plasmonic diamond films comprising plasmonic nanoparticles may be characterized by parameters such as the shape, size and distribution of the plasmonic nanoparticles. Each of these parameters may be tuned by adjusting the steps of the present methods as described above. The particular value of the parameters is not particularly limited, but rather depends upon the desired optical properties for the plasmonic diamond film, i.e., since the scattering, absorbance, and coupling properties of plasmonic nanoparticles depends upon their geometries and relative positions.

The shape of the plasmonic nanoparticles may be regular (well-defined by a circle, ellipse, ovoid, etc.) or irregular (better defined by a combination of shapes or other shapes such as a heart, a "c-shape", etc.) The plasmonic nanoparticles may be characterized by a diameter (circle), a major diameter (ellipse) or a width taken as the maximum distance across the plasmonic nanoparticle (for other shapes). These dimensions may be determined from top-view SEM images such as those shown in FIGS. 2B, 8A-8D, top-view TEM images such as those shown in FIGS. 16A-16C, or from cross-sectional SEM images such as that of FIGS. 7 and 17. The dimensions may be reported as an average dimension by which it is meant an average value from a representative number of plasmonic nanoparticles. However, the average diameter/width is in the nanoscale range, i.e., less than 1000 nm. In embodiments, the average diameter/width is less than 700 nm, less than 500 nm, less than 400 nm, less than 100 nm, less than 50 nm, less than 25 nm, or less than 10 nm. This includes embodiments in which the average diameter/width is in the range of from 10 nm to 500 nm, from 10 nm to 100 nm, or from 10 nm to 50 nm. For core-shell plasmonic nanoparticles, these values refer to the metal core.

The plasmonic diamond films may be further characterized by the distribution of the sizes of the plasmonic nanoparticles therein. In embodiments, the distribution is uniform. By "uniform" it is meant that the sizes (e.g., diameters) of the plasmonic nanoparticles in the film are within ±50%, ±40%, ±30%, ±20%, or ±10% of the average size. (See FIGS. 8A-8D.) In other embodiments, the distribution is not uniform and the plurality of plasmonic nanoparticles includes a broader range of sizes, and in some cases, a broader range of shapes. (See FIG. 2B.)

The plasmonic diamond films may be further characterized by the distribution of plasmonic nanoparticles within the continuous diamond matrix or across the surface of the underlying layer of diamond. In embodiments, the distribution is uniform, by which it is meant that the plasmonic nanoparticles are separated from each other by substantially equal amounts. (See FIGS. 9A-9B.)

Once formed, the plasmonic diamond films may be subjected to additional treatments, e.g., treatments to terminate the surface of the plasmonic diamond film with hydrogen or amino groups. Known techniques for hydrogen-terminated diamond may be used, e.g., see U.S. Pat. No. 8,986,532, which is hereby incorporated by reference in its entirety. Known techniques for amino-terminated diamond may be used, e.g., see U.S. Pat. No. 10,052,606, which is hereby incorporated by reference in its entirety. Such treatment techniques may also be used to alter the surface of the first layer of diamond prior to deposition of the layer of metal.

Figure 3:
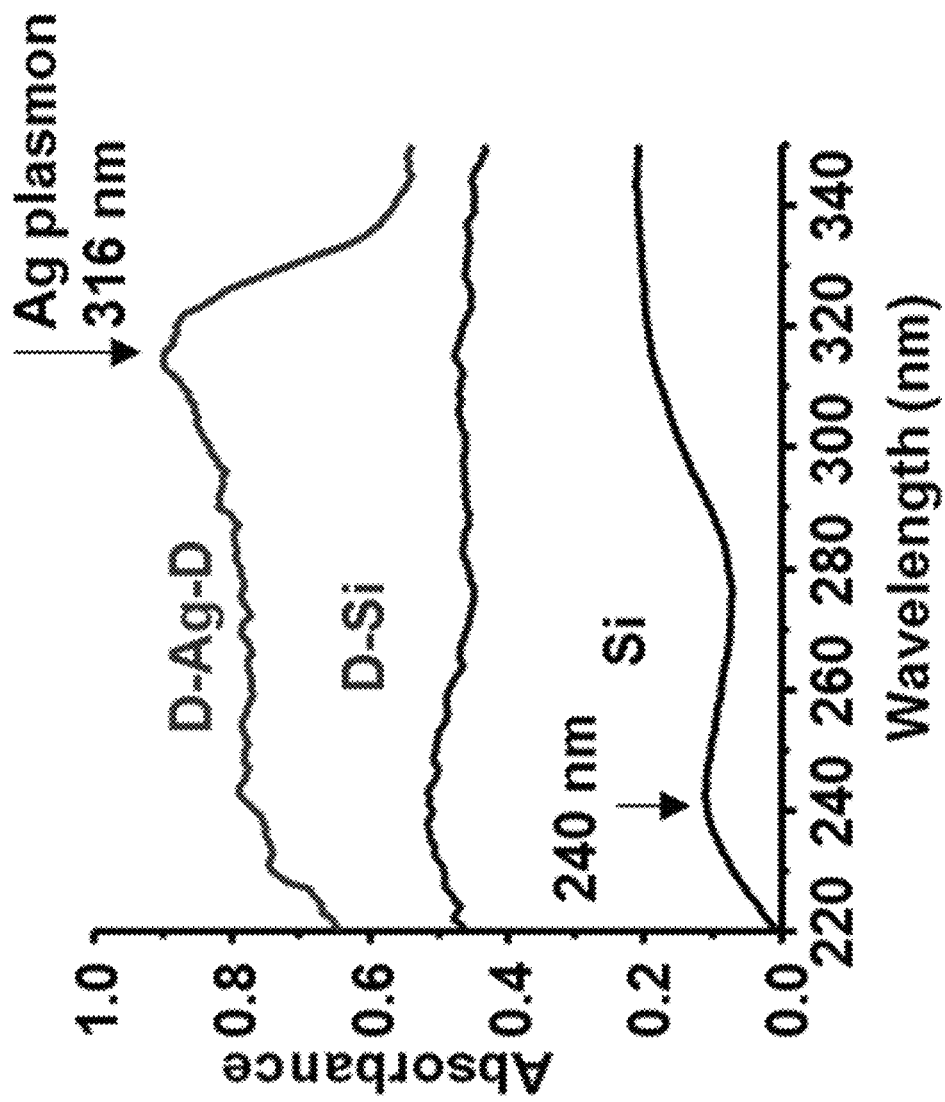
FIG. 3 shows diffuse reflectance spectra of D-Ag-D, D-Si, and the starting Si substrate. The D-Ag-D samples show clear formation of a plasmonic resonance peak at ~320 nm.

The plasmonic diamond films may be characterized by their optical properties, e.g., absorbance as measured using diffuse reflectance spectroscopy as described in the Examples below. Absorbance spectra of the plasmonic diamond films are characterized by one or more plasmonic resonance peaks, the specifications of which (e.g., wavelength, spectral width) depend upon the characteristics of the embedded plasmonic structure (e.g., thickness of the plasmonic layer; sizes and distribution of sizes of the plasmonic nanoparticles; type of metal). By way of illustration, FIG. 3 shows a plasmonic resonance peak at about 320 nm for a plasmonic diamond film formed according to Example 1, which corresponds to the embedded Ag nanoparticles. Although not shown in this figure, plasmonic resonance peaks at 450 nm and 625 nm were also observed. The spectral width of the plasmonic resonance peak is due to the relatively large distribution of shapes and sizes of the Ag nanoparticles. FIG. 3 also shows the overall increase in absorbance over the range of from 220 nm to 340 nm due to the increased scattering due, at least in part, to the plasmonic nanoparticles. FIG. 10 shows a distinct, sharp plasmonic resonance peak at about 350 nm for a plasmonic diamond film formed according Example 2, which corresponds to the embedded Ag nanoparticles. In this case, the spectral width of the plasmonic resonance is much narrower due to the uniform distribution of shapes and sizes of the Ag nanoparticles. (See FIGS. 9A-9B.) Absorbance spectra of other plasmonic diamond films are described in Example 3, below. (See FIGS. 14 and 15.) The absorbance spectra also show that the plasmonic nature of the plasmonic diamond films may be confirmed using diffuse reflectance spectroscopy.

The plasmonic diamond films are further characterized by their stability under extreme conditions such as a boiling acid treatment in concentrated $H_2SO_4/HNO_3/HClO_4$ for 24 hours and/or annealing at 1000° C. under vacuum for 6 hours. These extreme conditions have no material effect on the structure and properties of the plasmonic diamond films as described above.

Applications

The plasmonic diamond films may be used in a variety of applications. As shown in the Examples below, the enhanced optical absorbance described above translates to an enhancement in electron emission from the surface of the plasmonic diamond films and thus, increased photocatalytic activity. Thus, the plasmonic diamond films may be used to catalyze a variety of photoreduction reactions, e.g., the photoreduction of $N_2$ to $NH_3$, $CO_2$ to CO, etc. Any of the diamond catalyzed photoreductions described in U.S. Pat. No. 8,986,532 and U.S. Pat. Pub. No. 20170028378 may be carried out with the present plasmonic diamond films. These references also describe the systems and conditions which may be used to carry out the photocatalytic reductions. By way of illustration, Example 1, below, shows that a plasmonic diamond film comprising embedded Ag nanoparticles exhibits substantially greater ability (more than 3 times) to convert $N_2$ to $NH_3$ as compared to a non-plasmonic diamond film having no embedded Ag nanoparticles. (See FIG. 4A.)

The incorporation of plasmonic nanoparticles into diamond also changes the visually observable (i.e., by the naked eye) color of the diamond via a combination of interference effects and plasmonic scattering. This is shown in FIGS. 11A and 11B. FIG. 11A is a camera image of a non-plasmonic diamond film having no embedded Ag nanoparticles. The film appears black. FIG. 11B is a camera image of an illustrative plasmonic diamond film having embedded Ag nanoparticles. The color of the film varies from blue, to yellow-green, to orange, to purple across the surface of the film. As described above, the color may be tuned by adjusting the size, shape and distribution of the embedded plasmonic nanoparticles. This is illustrated in FIG. 15. The plasmonic diamond film formed from a 50 nm-thick layer of Ag appears yellow; the film formed from a 20 nm-thick layer of Ag appears pink; the film formed from a 10 nm-thick layer of Ag appears lighter pink to blue. Colored plasmonic diamond films have applications in decorative coatings, optical filters and other optical elements.

EXAMPLES

Example 1: Enhanced Photocatalytic Activity of Polycrystalline Diamond Thin Films Using Embedded Plasmonic Ag Nanoparticles In this Example, references to "Supporting Information" may be found in the enclosed Appendix.

Introduction

In this Example, it is shown that silver nanoparticles embedded into diamond thin films enhance the optical absorption and the photocatalytic activity toward the solvated electron-initiated reduction of $N_2$ to $NH_3$ in water. As described above, the integration of plasmonic structures into diamond has been prohibitively challenging because the typical growth temperatures of >700° C. can lead to rapid Ostwald ripening and reaction to form metal carbides with most metals. Here the formation of diamond films with embedded plasmonic Ag nanoparticles <100 nm in diameter is demonstrated. Deposition of a thin Ag layer into a polycrystalline diamond followed by a second diamond growth step leads to spontaneous formation of Ag nanoparticles that then become embedded within the diamond film. Cross-sectional scanning electron microscopy energy-dependent SEM, and energy-dispersive X-ray analysis confirm formation of encapsulated nanoparticles. Optical absorption measurements in the visible and ultraviolet region show that the resulting films exhibit plasmonic resonances. Measurements of photocatalytic activity using supra-bandgap ($\lambda$<225 nm) and sub-bandgap ($\lambda$>225 nm) excitation show significantly enhanced ability to convert $N_2$ to $NH_3$. Possible mechanisms for enhancement are discussed.

Experimental

Plasmonic Film Growth.

Diamond films with embedded Ag nanoparticles were fabricated by a two-step growth method, leading to Diamond-Ag-Diamond ("D-Ag-D") sandwich structures. Si substrates were cleaned by sonication with acetone and water for 10 min respectively and then seeded by sonication in a suspension of 100 nm diamond powder for 15 min, then dried in air. Diamond thin films were grown using microwave plasma enhanced chemical vapor deposition (PECVD) in a modified AsTex system following commonly used growth procedures,[33] including a nucleation step followed by a growth step. The nucleation step was performed using 200 standard cubic centimeters per minute (sccm) $H_2$ and 5 sccm $CH_4$ at a power of 1000 W for 10 min, at a pressure of 48 torr. Subsequent growth steps used 200 sccm $H_2$ and 2 sccm $CH_4$ at a power of 800 W. The first diamond layer was grown for 2 h, then transferred to an electron-beam metal evaporator and 100 nm Ag was deposited at a rate of 1 Å/s. This is followed by another diamond layer growth step using parameters identical to the first growth step, except that a growth time of 1 h was used. This process is shown in FIG. 1. Also prepared were control samples of diamond directly grown on Si (D-Si); the control samples shown here used a total diamond growth time of 3 h, the same as the total diamond growth time using in forming the D-Ag-D sandwich structures.

Seeding by spin-coating was also used. Specifically, seeding for the first layer of diamond (i.e., prior to nucleation/growth of the first diamond layer) and for the second layer of diamond (i.e., on top of the Ag nanoparticles) was also accomplished using a dispersion of diamond nanoparticles in water, instead of the ultrasonication technique. The nanoparticles used were nanoparticles of about 4 nm to 5 nm in diameter, commonly referred to as "detonation nanodiamond". In this second seeding method, the nanodiamond powder was dispersed into water and then spin-coated onto the growth substrate, using a convention spin-coater at a spin rate of 500 RPM (30 sec) followed by 3000 RPM (30 sec).

Diamond Film Characterization.

Scanning electron microscopy (SEM) and Energy-Dispersive X-Ray Spectroscopy (EDS) measurements were carried out using a Leo Gemini Supra 55 VP microscope. To best capture film morphology, an SE2 detector was used for imaging. Energy dispersive X-ray spectra were obtained on this same instrument using a ThermoFisher UltraDry Compact EDS detector. Raman spectroscopy was performed using Aramis Confocal Raman Microscope with excitation at 442 nm. Diffuse Reflectance Spectroscopy was performed using a Jasco V-570 spectrometer with a model ISN-470 integrating sphere. X-ray photoelectron spectroscopy (XPS) data were obtained using a custom-built ultrahigh vacuum (P<6×10$^{-10}$ Torr) Physical Electronics system equipped with an aluminum Kα source, a quartz-crystal X-ray monochromator, and a 16-channel detector array.

Photoinitiated Reduction of $N_2$ to $NH_3$.

Ammonia yield experiments were carried out using a 450 W high-pressure Hg/Xe lamp (Osram, model 6278) mounted in an Oriel lamp housing located 10 in. from the samples as the source of light. A water absorptive filter was used to eliminate infrared radiation. Pure $N_2$ (Airgas research grade, 99.9997% minimum purity) gas was passed through a Johnson Matthey IG-70XL PureGuard catalytic purifier and slowly bubbled for 1 h through the reaction vessel, which contained 18.0 MΩ water (Barnsted NanoPure) with 0.01 M of high-purity (Alfa Puratronic, 99.9955%) $Na_2SO_4$. After saturation of the reaction vessel with $N_2$, the cell was sealed and exposed to the light for different times. The reaction vessel is constructed of UV-grade fused silica and has an H-cell configuration with the diamond electrode contained in one compartment and a second compartment containing a platinum electrode immersed in a 0.01 M solution of 1:1 $Na_2SO_4/Na_2SO_3$ in water. The Pt electrode is electrically connected to the diamond sample external to the cell. For some experiments, the light was spectrally filtered using optical filters to achieve illumination only at wavelength >225 nm or >285 nm.

The photo-initiated production of ammonia was measured by illuminating the sample for specific lengths of time and characterizing the amount of $NH_3$ present at the end of the experiment using the indophenol blue method.[34] Reagents were purchased from Sigma-Aldrich in the highest available purity. A 2 ml aliquot of solution was removed from the reaction vessel. To this solution added 0.100 ml of a 1 M NaOH solution containing 5% salicylic acid and 5% sodium citrate (by weight) was added, followed by addition of 20 μl of 0.05 M NaClO and 20 μl of an aqueous solution of 1% (by weight) Na [Fe(NO)(CN)$_5$] (sodium nitroferricyanide). After 1 h, the absorption spectrum was measured using a Shimadzu 2401PC ultraviolet-visible spectrophotometer. The formation of indophenol blue was determined using the absorbance at a wavelength of 700 nm. Absolute calibration of the method was achieved using ammonium chloride solutions of known concentration as standards. In order to ensure that the observed $NH_3$ did not arise from contaminants, a number of different control experiments were performed in this same manner, but leaving out one or more of the critical catalytic factors (e.g., using Ar instead of $N_2$, or leaving the sample in the dark instead of illuminating it) as described below.

Results

Figure 2C:
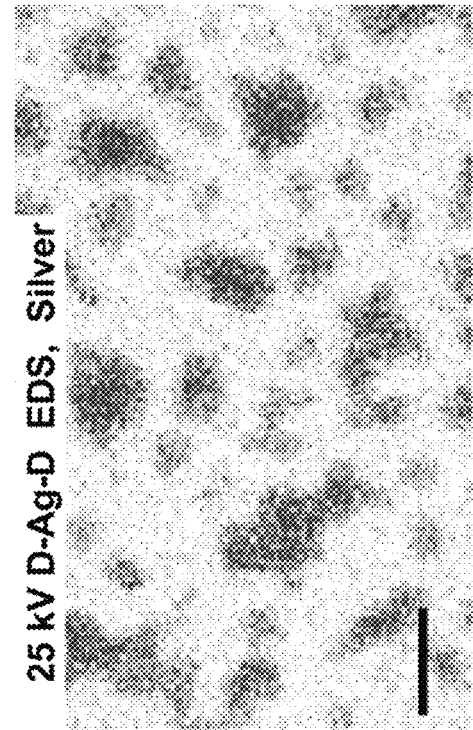
FIGS. 2A-2E show the physical characterization of the D-Ag-D sandwich structure.
Figure 2D:
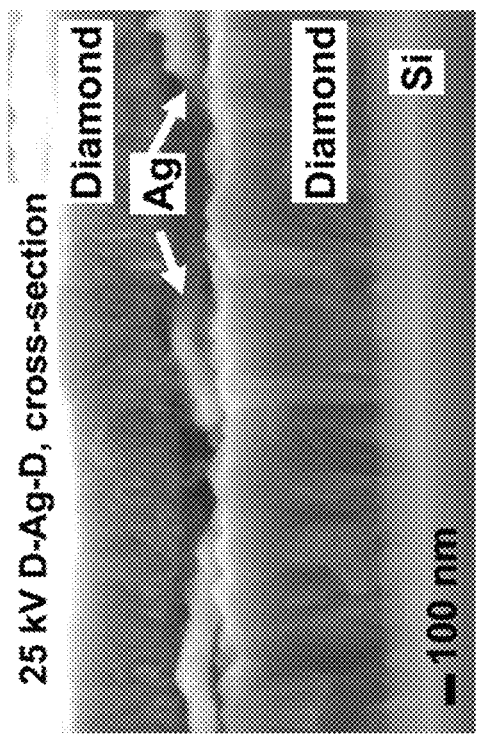
Figure 2A:
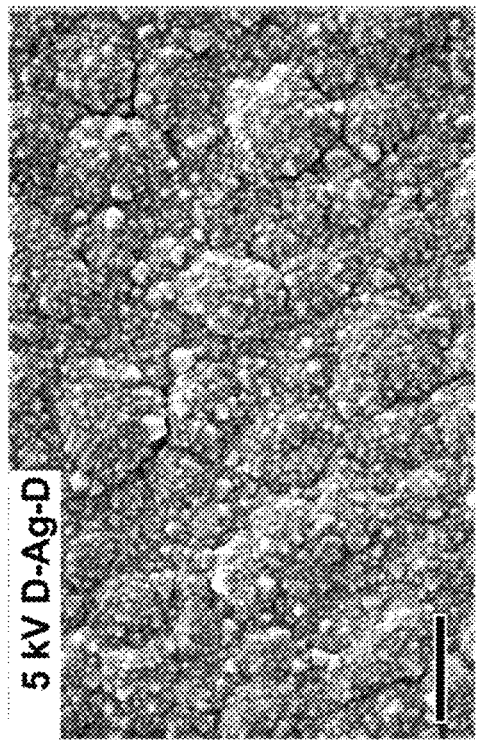
Figure 2B:
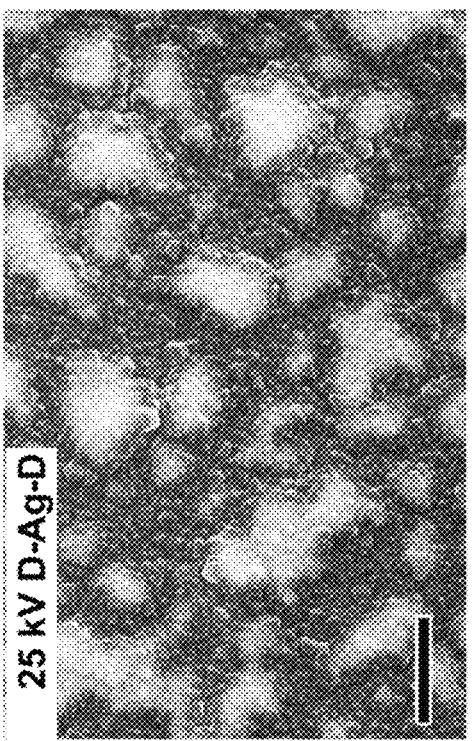

FIGS. 2A-2C show SEM data obtained over a single region of the D-Ag-D sample. FIG. 2A shows scanning an SEM image (using a SE2 detector to detect the low-energy secondary electrons) of the D-Ag-D sample using 5 kV excitation, while FIG. 2B shows the same region using 25 kV excitation. FIG. 2C shows an EDS spatial map for Ag (bright color (dark)=high emission, white=low emission).

In FIG. 2A, the D-Ag-D surface shows crystallites typically 100-500 nm across; at the 5 kV electron energy used in here, the image reflects the surface topography. FIG. 2B shows the identical sample region measured using an incident electron beam of 25 kV energy. Under these conditions the D-Ag-D-Si sample shows distinct regions of higher electron yield (bright in images) from the buried Ag layer, and some smaller structures with diameters of <1 μm are visible. FIG. 2C shows EDS data obtained simultaneously with FIG. 2B (2.98 keV emission energy), showing the spatial distribution of Ag. In this image, more intense color (darker) corresponds to high Ag X-ray emission. The regions where high Ag emission is observed in FIG. 2C correspond to the bright regions where high electron emission occurs in FIG. 2B. When the incident beam energy was reduced to 5 kV for EDS mapping, no Ag X-ray emission was detected from the D-Ag-D structure, while emission was observed in control studies using Ag nanoparticles on top of the diamond sample. A complete set of images at intermediate voltages is included in Supporting Information. FIG. 2d shows a cross-sectional SEM image of D-Ag-D. Here, the two diamond layers can be identified, as well as the Ag present at the interlayer. The presence of Ag has some effect on the diamond growth morphology, leading to crystallites with less well-defined surface facets, but still exhibiting a columnar growth morphology typically of diamond growth. The SEM and EDS data in FIG. 2 show that the procedure followed here produces Ag nanoparticles buried between two diamond layers. To investigate the surface composition of D-Ag-D, XPS spectra were measured as shown in Supporting Information (FIG. S5). The XPS survey spectrum shows only carbon with no evidence for Ag or O at the surface. Additional characterization data, including EDS maps for other elements, EDS images obtained at different electron beam energies, SEM and EDS images for control samples of diamond on silicon (D-Si) control samples, and both SEM images and EDS maps of cross-sectional views of D-Ag-D sandwich structures and D-Si showing nanoparticles with diameters <100 nm are also shown in Supporting Information.

Figure 2E:
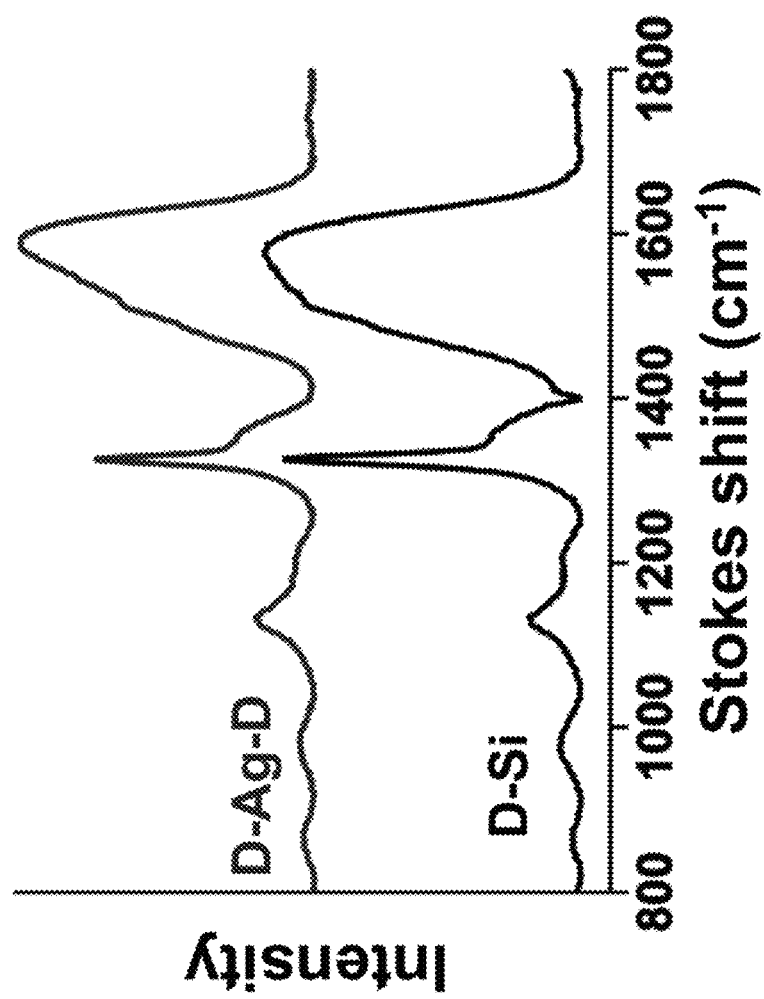

The quality of the D-Ag-D films and of D-Si samples was characterized using Raman spectroscopy. As shown in FIG. 2E, the D-Ag-D sandwich structure and the D-Si control sample both exhibit a clear peak at ~1332 cm$^{-1}$ that is characteristic of crystalline diamond,[35] along with modest peaks in the 1580-1600 cm$^{-1}$ range where amorphous carbon and graphitic carbon are observed. Previous studies have shown that the cross-section for Raman scattering of sp$^2$-hybridized carbon is approximately 100 times higher than that for sp$^3$-hybridized diamond.[36-37] One prior study of diamond-Ag heterostructures showed that Ag nanoparticles deposited onto diamond films lead to great enhancement in the intensity of the graphitic carbon peaks while leaving the crystalline diamond peak unaffected.[25] Based on these results it was concluded that the diamond films retain a high degree of crystallinity. There may be small amounts of graphitic materials within the lattice or at the Ag-diamond interface, but these amounts are not significantly different in films containing embedded Ag nanoparticles compared with films not containing nanoparticles.

To determine whether the embedded Ag influenced the optical properties of the diamond film, the optical absorption of the film was measured via UV-Visible Diffuse Reflectance Spectroscopy (DRS) using an integrating sphere. This approach was used because the incorporation of Ag into the diamond film is accompanied by changes in both optical absorption and in scattering from the film. FIG. 3 shows DRS spectra of a D-Ag-D structure and corresponding data for a simple film of diamond on silicon under similar conditions, along with the starting Si substrate in the ultraviolet region. Note that the spectra are presented as acquired without any vertical shifting; the D-Ag-D shows increased absorbance across the entire wavelength region and also exhibits a new peak in the absorption spectrum at approximately ~320 nm that is not present on the other two samples.

All three samples also show a feature near 240 nm; this feature has been reported previously and corresponds to the direct bandgap transition of silicon.[38] Over the entire wavelength region shown, the absorbance increases going from a polished Si wafer to the D-Si structure and finally to the D-Ag-D structure.

Based on prior studies,[39-41] the peak at ~320 nm is attributed to the out-of-plane quadrupolar plasmon resonance arising from the buried Ag nanostructures in the D-Ag-D. In addition to this quadrupolar plasmon, diffuse reflectance measurements of D-Ag-D structures in the visible wavelength region (see FIG. S9) also exhibit Ag plasmonic peaks near 450 nm and 625 nm, in agreement with previous studies.[41-42] All the plasmonic peaks are broadened due to the random distribution of size, shape and orientation of Ag particles.[43-45] While heterogeneous samples can give rise to plasmonic features extending throughout the visible and UV range[41] The greater absorbance of D-Ag-D over the entire wavelength region likely arises in part from increased scattering within the film, which then gives rise to increased absorption due both to the plasmonic particles and also possibly from graphitic impurities. The results in FIG. 3 and in Supporting Information show that the presence of the buried Ag nanostructures increases the optical absorption in the visible and ultraviolet region down to the instrumental limit of 220 nm. Although the films were only probed down to 220 nm, the increased absorbance observed at this limit strongly suggests that the embedded nanostructures also increase the absorption for photon energies above diamond's bandgap ($\lambda$<225 nm).

Ultimately, one goal in making D-Ag-D nanostructures is to enhance the electron emission from diamond when illuminated with light in the UV and in the visible region of the spectrum. It has been shown that diamond samples illuminated with above-bandgap light induce the reduction of $N_2$ to $NH_3$ in aqueous solution.[1-2] Mechanistic studies[2] showed that this occurs by direct emission of electrons from diamond's conduction band into water, where it induces reduction of $H^+$ to H. (solvated hydrogen atom), which then binds to $N_2$ to form $N_2H$., the highest-energy intermediate along the $N_2 \rightarrow NH_3$ reaction pathway.[6] Indeed, it has been shown that there is a strong correlation between the ability to emit electrons into vacuum and the ability to induce photochemical reduction of $N_2$ to $NH_3$.[1, 3-4] Thus, the ability to reduce $N_2$ to $NH_3$ is a proxy for the ability of diamond to emit electrons into water. Here, the electron emission properties of the diamond heterostructures were evaluated using the ability of the illuminated structures to induce photochemical reduction of $N_2$ to $NH_3$.[1, 4] These experiments were performed in a dual-compartment cell while applying a small negative bias (–0.5 V) to the diamond with respect to the open-circuit potential. The small negative voltage is applied in order to ensure that the valence and conduction band edges are bent downwards at the diamond-water interface.[46]

FIG. 4A shows the total ammonia yield produced as a function of illumination time for the D-Ag-D structure and the simple diamond-on-silicon film (D-Si) when illuminated with full-spectrum light from a high-pressure Xe lamp. In both cases the ammonia yield increases approximately linearly with time over the 16-hour duration of the experiment, with the D-Ag-D structure producing almost 3.5 times as much $NH_3$ compared with the D-Si structure: (213 nmol/cm$^2$ vs. 61.4 nmol/cm$^2$). In order to evaluate how the ammonia yield varies with wavelength, filters were used to restrict the wavelengths of the illuminating light. In each case the ammonia yield was measured after 5 hours. FIG. 4B shows the resulting ammonia yields. As in FIG. 4A, when using full-spectrum light with no filters the ammonia yield from the D-Ag-D plasmonic film is approximately 3.5 times as high as that of a diamond-on-silicon (D-Si) film used as a control. When a filter is applied that eliminates the UV at wavelengths <225 nm, the D-Ag-D ammonia yield is reduced slightly to 65.5 nmol/cm$^2$, while for D-Si the yield is only 13.1 nmol/cm$^2$, which is near the detection limit using the indophenol blue method. If the range of excitation wavelengths is further restricted to only pass wavelengths >280 nm, the D-Ag-D still exhibits a yield of 30.0 nmol/cm$^2$ ammonia, while for D-Si the yield is again close to 13 nm/cm$^2$, close to the background detection level.

To verify there are no contaminations or other factors influencing the system and characterization, a number of additional control experiments were conducted, with data summarized in Supporting Information FIG. S11. In brief, these include a dark control (D-Ag-D structure immersed for 5 hours in $N_2$-purged water with –0.5 V applied field and no illumination yielding 6.7 nmol/cm$^2$), an Ar control (water purged with Ar instead of $N_2$ and illuminated for 5 hours yielding 2.8 nmol/cm$^2$), and ammonia yield from a bare Si substrate in $N_2$-purged water and illuminated for 5 hours yielding 20.2 nmol/cm$^2$. Additional control experiments were run to ensure that the CaF$_2$ window did not contribute to the $N_2$ yield. Also, D-Ag-D samples terminated with oxygen (via exposure to light at 254 and 185 nm from a low-pressure mercury lamp in air for 3 h) were used as control samples. O-terminated D-Ag-D shows an obvious oxygen peak in XPS (FIG. S10) but the ammonia yield after 5 hours of illumination was only 6.4 nmol/cm$^2$; this very low value shows that hydrogen-termination is necessary for diamond negative electron affinity as previously reported. These control experiments all confirm that the background influences are small and establish that the $N_2$ reduction to ammonia arises from electron emission from the diamond surface and not from contamination or other factors.

As noted above, previous studies have reported growth of diamond films at lower temperatures, in some cases <300° C. when measured at the underlying sample stage. To evaluate the influence of sample temperature, studies were also conducted using a lower growth temperature of 400° C. for the sample stage. Under these conditions the initial diamond film showed reduced crystallite size. More importantly, under these conditions the Ag layer did not dewet into discrete nanostructures. Subsequent growth of a second diamond layer produced a sample that exhibited poor photocatalytic efficiency, producing only 23 nmol/cm$^2$ of $NH_3$ over a 5 hr period.

Discussion

The above results show that the incorporation of Ag embedded into a diamond film leads to significant enhancements in the ability to photocatalytically reduce $N_2$ to $NH_3$. The significant increase of the ammonia yield of D-Ag-D compared to D-Si is clearly due to the Ag layer embedded in the diamond. As prepared here, spontaneous de-wetting of Ag from the first diamond layer produces particles in a range of sizes that then become embedded upon growth of the second layer. While on smooth surfaces diffusion leads to coalescence of the Ag into large 3-dimensional islands, it is thought that the intrinsic roughness of the first diamond layer plays a role in restricting diffusion and allowing Ag of small sizes to become trapped within the growing film during the diamond second growth step. It is noted that a recent study reported that heating of diamond-Ag mixtures in air leads to formation of Ag nanoparticles bound to the (100) face of diamond but not on the (111) face.[47] In that prior work, it is likely that various carbon oxides are involved in controlling the Ag adhesion; such interface chemistry is unlikely under the highly reducing conditions of the present studies.

The observed enhancement in ammonia yield observed likely involves contributions from several different mechanisms, including direct impact on electron transfer as well as through enhanced optical scattering.[48-50][51] Optical scattering increases the effective path length through which photons traverse, thereby increasing the probability of being absorbed near the surface.[51] Based on the visual appearance of the films, it is likely that increased light-scattering within the diamond film plays some role in the enhanced photocatalytic efficiency. Plasmonic nanoparticles may also enhance absorption through direct enhancement of the optical electric field via coupling to the plasmonic resonance.[52]

The observation of enhanced yield at sub-bandgap wavelengths >280 nm is particularly significant, since it demonstrates the ability to achieve photocatalysis at sub-bandgap wavelengths. The out-of-plane quadrupole resonance should play a more important role for the enhancement as it lies in the UV region. It is reported that quadrupole resonances get more significant when Ag nanoparticles are larger, while the size and shape of smaller Ag nanoparticles can also give rise to the quadrupole resonance mode, which makes the peak at ~320 nm broadened.[39, 44] The plasmonic peaks at longer wavelengths are attributed to the dipole resonance and in-plane quadrupole resonance modes. Even though excited state lifetimes of metals are short, it is now well known that excitation of nanoparticles even with relatively weak, continuous illumination sources (with correspondingly modest electric fields) can lead to electron injection into adjacent semiconductors.[50][48] Sub-bandgap photoemission from diamond at energies down to 4.4 eV (282 nm) has been shown previously to occur by direct emission from surface valence band states to free-electron states in vacuum[11, 53] and should presumably also be possible in water at even lower energy if electrons can be emitted directly into the conduction band of water,[15] which lies 1.1 eV below the vacuum level[14] and approximately 3.3 eV above diamond's valence band. Electron emission from diamond using sub-bandgap excitation can also arise from excitations involving small amounts of graphitic, sp$^2$-hybridized carbon within the diamond films[54] and at the surface.[53] In diamond films grown by chemical vapor deposition (as is used here), graphitic impurities occur at grain boundaries between individual diamond crystallites and give rise to increased absorbance.[30] These impurities can also provide electrical conductivity through undoped films.[55] Thus, one likely role of the Ag nanoparticles is to directly interact with the electric field of the incident light, locally amplifying the electric field. In order to induce an enhancement of the photocatalytic efficiency using nanoparticles that are embedded within the film, however, the injection of electrons into diamond must also be accompanied by the injection of holes into diamond. These holes presumably could be injected either into the valence band or into the graphitic impurities described above.

Conclusions

This Example demonstrates that embedding of plasmonic nanoparticles into diamond films markedly enhance the photocatalytic activity toward reduction of $N_2$ to $NH_3$. The absence of stable silver carbide phases and the highly reducing conditions used for diamond growth ensure that the Ag particles remain in their metallic state even while being embedded into a growing diamond film. While dewetting leads to a distribution of particle sizes, optical spectra of the films reveal increased absorbance and a clear plasmonic peak at both UV and visible wavelengths. The increased absorption and scattering leads to an increase in diamond's ability to emit electrons and to induce the ensuing electron-induced reduction of nitrogen to $NH_3$.[1-2]

REFERENCES (1) Zhu, D.; Zhang, L.; Ruther, R. E.; Hamers, R. J. Photo-Illuminated Diamond as a Solid-State Source of Solvated Electrons in Water for Nitrogen Reduction. *Nat. Mater.* 2013, 12, 836-841.

(2) Christianson, J. R.; Zhu, D.; Hamers, R. J.; Schmidt, J. R. Mechanism of $N_2$ Reduction to $NH_3$ by Aqueous Solvated Electrons. *J. Phys. Chem. B* 2014, 118, 195-203.

(3) Zhu, D.; Bandy, J. A.; Li, S.; Hamers, R. J. Amino-Terminated Diamond Surfaces: Photoelectron Emission and Photocatalytic Properties. *Surf. Sci.* 2016, 650, 295-301.

(4) Bandy, J. A.; Zhu, D.; Hamers, R. J. Photocatalytic Reduction of Nitrogen to Ammonia on Diamond Thin Films Grown on Metallic Substrates. *Diamond Relat. Mater.* 2016, 64, 34-41.

(5) Zhang, L.; Zhu, D.; Nathanson, G. M.; Hamers, R. J. Selective Photoelectrochemical Reduction of Aqueous $CO_2$ to CO by Solvated Electrons. *Angew. Chem.* 2014, 126, 9904-9908.

(6) Bazhenova, T.; Shilov, A. Nitrogen Fixation in Solution. *Coord. Chem. Rev.* 1995, 144, 69-145.

(7) Skulason, E.; Bligaard, T.; Gudmundsdottir, S.; Studt, F.; Rossmeisl, J.; Abild-Pedersen, F.; Vegge, T.; Jonsson, H.; Norskov, J. K. A Theoretical Evaluation of Possible Transition Metal Electro-Catalysts for $N_2$ Reduction. *Phys. Chem. Chem. Phys.* 2012, 14, 1235-1245.

(8) Oshikiri, T.; Ueno, K.; Misawa, H. Selective Dinitrogen Conversion to Ammonia Using Water and Visible Light through Plasmon-Induced Charge Separation. *Angew. Chem.* 2016, 428, 1010-1014.

(9) van der Ham, C. J.; Koper, M. T.; Hetterscheid, D. G. Challenges in Reduction of Dinitrogen by Proton and Electron Transfer. *Chem. Soc. Rev.* 2014, 43, 5183-5191.

(10) Himpsel, F. J.; Knapp, J. A.; Vanvechten, J. A.; Eastman, D. E. Quantum Photoyield of Diamond(111)—Stable Negative-Affinity Emitter. *Phys.l Rev. B* 1979, 20, 624-627.

(11) Takeuchi, D.; Kato, H.; Ri, G.; Yamada, T.; Vinod, P.; Hwang, D.; Nebel, C.; Okushi, H.; Yamasaki, S. Direct Observation of Negative Electron Affinity in Hydrogen-Terminated Diamond Surfaces. *Appl. Phys. Lett.* 2005, 86, 152103.

(12) Bozeman, S.; Baumann, P.; Ward, B.; Powers, M.; Cuomo, J. J.; Nemanich, R.; Dreifus, D. Electron Emission Measurements from CVD Diamond Surfaces. *Diamond Relat. Mater.* 1996, 5, 802-806.

(13) Baumann, P.; Nemanich, R. Electron Affinity and Schottky Barrier Height of Metal-Diamond (100), (111), and (110) Interfaces. *J. Appl. Phys.* 1998, 83, 2072-2082.

(14) Grand, D.; Bernas, A.; Amouyal, E. Photo-Ionization of Aqueous Indole—Conduction-Band Edge and Energy-Gap in Liquid Water. *Chem. Phys.* 1979, 44, 73-79.

(15) Williams, F.; Varma, S.; Hillenius, S. Liquid Water as a Lone-Pair Amorphous Semiconductor. *T. J. Chem. Phys.s* 1976, 64, 1549-1554.

(16) Edwards, D. F.; Philipp, H. R., Cubic Carbon (Diamond) Palik, Edward D. In *Handbook of Optical Constants of Solids*, Academic Press: Burlington, 1997, pp 665-673.

(17) Yater, J. E.; Shih, A.; Butler, J. E.; Pehrsson, P. E. Electron Transport Mechanisms in Thin Boron-Doped Diamond Films. *J. Appl. Phys.* 2004, 96, 446-453.

(18) Linic, S.; Christopher, P.; Ingram, D. B. Plasmonic-Metal Nanostructures for Efficient Conversion of Solar to Chemical Energy. *Nat. Mater.* 2011, 10, 911-921.

(19) Jiang, R.; Li, B.; Fang, C.; Wang, J. Metal/Semiconductor Hybrid Nanostructures for Plasmon-Enhanced Applications. *Adv. Mater.* 2014, 26, 5274-5309.

(20) Knight, M. W.; King, N. S.; Liu, L.; Everitt, H. O.; Nordlander, P.; Halas, N. J. Aluminum for Plasmonics. *ACS Nano* 2014, 8, 834-840.

(21) Rycenga, M.; Cobley, C. M.; Zeng, J.; Li, W. Y.; Moran, C. H.; Zhang, Q.; Qin, D.; Xia, Y. N. Controlling the Synthesis and Assembly of Silver Nanostructures for Plasmonic Applications. *Chem. Rev.* 2011, 111, 3669-3712.

(22) Jain, P. K.; Huang, X. H.; El-Sayed, I. H.; El-Sayed, M. A. Noble Metals on the Nanoscale: Optical and Photothermal Properties and Some Applications in Imaging, Sensing, Biology, and Medicine. *Acc. Chem. Res.* 2008, 41, 1578-1586.

(23) Mukherjee, S.; Libisch, F.; Large, N.; Neumann, O.; Brown, L. V.; Cheng, J.; Lassiter, J. B.; Carter, E. A.; Nordlander, P.; Halas, N. J. Hot Electrons Do the Impossible: Plasmon-Induced Dissociation of $H_2$ on Au. *Nano Lett.* 2013, 13, 240-247.

(24) McMahon, J. M.; Schatz, G. C.; Gray, S. K. Plasmonics in the Ultraviolet with the Poor Metals Al, Ga, in, Sn, Tl, Pb, and Bi. *Phys. Chem. Chem. Phys.* 2013, 15, 5415-5423.

(25) LopezRios, T. Diamond Films Studied by Surface-Enhanced Raman Scattering. *Diamond Relat. Mater.* 1996, 5, 608-612.

(26) Izak, T.; Babchenko, O.; Potocky, S.; Remes, Z.; Kozak, H.; Verveniotis, E.; Rezek, B.; Kromka, A., Low Temperature Diamond Growth. In Nanodiamond, Williams, O. A., Ed. Royal Soc Chemistry: Cambridge, 2014, pp 290-342.

(27) Babchenko, O.; Kozak, H.; Izak, T.; Stuchlik, J.; Remes, Z.; Rezek, B.; Kromka, A. Fabrication of Diamond-Coated Germanium ATR Prisms for IR-Spectroscopy. *Vib. Spectrosc* 2016, 84, 67-73.

(28) Ouyang, R. H.; Liu, J. X.; Li, W. X. Atomistic Theory of Ostwald Ripening and Disintegration of Supported Metal Particles under Reaction Conditions. *J. Am. Chem. Soc.* 2013, 135, 1760-1771.

(29) Campbell, C. T.; Sellers, J. R. V. Anchored Metal Nanoparticles: Effects of Support and Size on Their Energy, Sintering Resistance and Reactivity. *Faraday Discuss.* 2013, 162, 9-30.

(30) Robins, L.; Farabaugh, E.; Feldman, A. Determination of Optical-Constants of Diamond Thin-Films by Transmittance and Reflectance Spectroscopy-Experiment and Model-Calculations. *Diamond Films Technol.* 1995, 5, 199-224.

(31) Kelly, K. L.; Coronado, E.; Zhao, L. L.; Schatz, G. C. The Optical Properties of Metal Nanoparticles: The Influence of Size, Shape, and Dielectric Environment. *J. Phys. Chem. B* 2003, 107, 668-677.

(32) Karakaya, I.; Thompson, W. T., Ag—C Phase Diagram. In *Binary Allloys Phase Diagrams*, Massalski, T. B., Ed. ASM Materials International: Materials Park, O H, 1990, pp 18-20.

(33) May, P. W. Diamond Thin Films: A 21st-Century Material. *Philos. Trans. R. Soc., A* 2000, 358, 473-495.

(34) Ivancic, I.; Degobbis, D. An Optimal Manual Procedure for Ammonia Analysis in Natural-Waters by the Indophenol Blue Method. *Water Res.* 1984, 18, 1143-1147.

(35) Ager III, J. W.; Veirs, D. K.; Rosenblatt, G. M. Spatially Resolved Raman Studies of Diamond Films Grown by Chemical Vapor Deposition. *Phys. Rev. B* 1991, 43, 6491-6499.

(36) Knight, D. S.; White, W. B. Characterization of Diamond Films by Raman-Spectroscopy. *J. Mater. Res.* 1989, 4, 385-393.

(37) Sails, S. R.; Gardiner, D. J.; Bowden, M.; Savage, J.; Rodway, D. Monitoring the Quality of Diamond Films Using Raman Spectra Excited at 514.5 nm and 633 nm. *Diamond Relat. Mater.* 1996, 5, 589-591.

(38) Gustafson, P. An Evaluation of the Thermodynamic Properties and the P-Phase, T-Phase Diagram of Carbon. *Carbon* 1986, 24, 169-176.

(39) Jin, R. C.; Cao, Y. C.; Hao, E. C.; Metraux, G. S.; Schatz, G. C.; Mirkin, C. A. Controlling Anisotropic Nanoparticle Growth through Plasmon Excitation. *Nature* 2003, 425, 487-490.

(40) Liu, X.; Li, D.; Sun, X.; Li, Z.; Song, H.; Jiang, H.; Chen, Y. Tunable Dipole Surface Plasmon Resonances of Silver Nanoparticles by Cladding Dielectric Layers. *Sci. Rep.* 2015, 5, 12555.

(41) Thouti, E.; Chander, N.; Dutta, V.; Komarala, V. K. Optical Properties of Ag Nanoparticle Layers Deposited on Silicon Substrates. *J. Opt.* 2013, 15, 7.

(42) Wu, X. M.; Redmond, P. L.; Liu, H. T.; Chen, Y. H.; Steigerwald, M.; Brus, L. Photovoltage Mechanism for Room Light Conversion of Citrate Stabilized Silver Nanocrystal Seeds to Large Nanoprisms. *J Am. Chem. Soc.* 2008, 130, 9500-9506.

(43) Jiang, M.-M.; Chen, H.-Y.; Li, B.-H.; Liu, K.-W.; Shan, C.-X.; Shen, D.-Z. Hybrid Quadrupolar Resonances Stimulated at Short Wavelengths Using Coupled Plasmonic Silver Nanoparticle Aggregation. *J. Mat. Chem. C* 2013, 2, 56-63.

(44) Jin, R. C.; Cao, Y. W.; Mirkin, C. A.; Kelly, K. L.; Schatz, G. C.; Zheng, J. G. Photoinduced Conversion of Silver Nanospheres to Nanoprisms. *Science* 2001, 294, 1901-1903.

(45) Sardana, S. K.; Chava, V. S. N.; Thouti, E.; Chander, N.; Kumar, S.; Reddy, S. R.; Komarala, V. K. Influence of Surface Plasmon Resonances of Silver Nanoparticles on Optical and Electrical Properties of Textured Silicon Solar Cell. *Appl. Phys. Lett.* 2014, 104, 5.

(46) Zhang, Z.; Yates Jr, J. T. Band Bending in Semiconductors: Chemical and Physical Consequences at Surfaces and Interfaces. *Chem. Rev.* 2012, 112, 5520-5551.

(47) Bokhonov, B. B.; Kato, H. Selective Growth of Silver Particles on the Facets of Synthetic Diamond. *CrystEngComm* 2016, 18, 7430-7434.

(48) Clavero, C. Plasmon-Induced Hot-Electron Generation at Nanoparticle/Metal-Oxide Interfaces for Photovoltaic and Photocatalytic Devices. *Nat. Photonics* 2014, 8, 95-103.

(49) Lindstrom, C. D.; Zhu, X. Y. Photoinduced Electron Transfer at Molecule-Metal Interfaces. *Chem. Rev.* 2006, 106, 4281-4300.

(50) Wu, X.; Thrall, E. S.; Liu, H.; Steigerwald, M.; Brus, L. Plasmon Induced Photovoltage and Charge Separation in Citrate-Stabilized Gold Nanoparticles. *J Phys. Chem. C* 2010, 114, 12896-12899.

(51) Nakayama, K.; Tanabe, K.; Atwater, H. A. Plasmonic Nanoparticle Enhanced Light Absorption in Gaas Solar Cells. *Appl. Phys. Lett.* 2008, 93, 3.

(52) Hou, W. B.; Hung, W. H.; Pavaskar, P.; Goeppert, A.; Aykol, M.; Cronin, S. B. Photocatalytic Conversion of $CO_2$ to Hydrocarbon Fuels Via Plasmon-Enhanced Absorption and Metallic Interband Transitions. *ACS Catalysis* 2011, 1, 929-936.
(53) Takeuchi, D.; Nebel, C. E.; Yamasaki, S. Surface Defect States Analysis on Diamond by Photoelectron Emission Yield Experiments. *Diamond Relat. Mater.* 2007, 16, 823-825.
(54) Cui, J.; Ristein, J.; Ley, L. Low-Threshold Electron Emission from Diamond. *Phys. Rev. B* 1999, 60, 16135-16142.
(55) Nath, S.; Wilson, J. I. B. Impedance Measurements on CVD Diamond. *Diamond Relat. Mater.* 1996, 5, 65-75.

Example 2: Encapsulation of Ag Nanoparticles into Diamond Thin Films Using Microwave Plasma In this Example, diamond films with embedded Ag nanoparticles were grown using a method similar to that described in Example 1, except using an additional microwave plasma step. In particular, diamond films with embedded Ag nanoparticles were fabricated by a two-step growth method, leading to Diamond-Ag-Diamond ("D-Ag-D") sandwich structures. Si substrates were cleaned by sonication with acetone and water for 10 min respectively and then seeded by sonication in a suspension of 100 nm diamond power for 15 min, then dried in air. Diamond thin films were grown using microwave plasma enhanced chemical vapor deposition (PECVD) in a modified AsTex system microwave (2.54 GHz) system following commonly used growth procedures, including a nucleation step followed by a growth step. The nucleation step was performed using 200 standard cubic centimeters per minute (sccm) $H_2$ and 5 sccm $CH_4$ at a power of 1000 W for 10 min, at a pressure of 48 torr. Subsequent growth steps used 200 sccm $H_2$ and 2 sccm $CH_4$ at a power of 800 W. The first diamond layer was grown for 3 h, then transferred to an electron-beam metal evaporator and a layer of Ag was deposited at a rate of 0.1 Å/s. Then the as-grown diamond film with Ag film coating was seeded again with the diamond power. At this point, by contrast to Example 1, above, the diamond-seeded Ag film coating was transferred into the PECVD chamber and exposed to a 10 min $H_2$ plasma treatment at 600 W. This was followed by another diamond layer growth step with 200 sccm $H_2$ and 2 sccm $CH_4$ for 1 h at 800 W power.

The characterization of the ("D-Ag-D") sandwich structures and intermediate structures (e.g., SEM, EDS, DRS) was carried out as described in Example 1, above.

FIGS. 6A and 6B show SEM images of the diamond-seeded Ag film after the microwave plasma treatment. The images clearly show the dewetting of the Ag film into discrete Ag nanoparticles having an average diameter of about 50 nm. Compared to Example 1 (FIGS. 2A-2C), the Ag nanoparticles in FIGS. 6A-6B exhibit greater uniformity in shape, size and distribution across the underlying diamond layer.

FIG. 7 shows a cross-sectional SEM image of a D-Ag-D structure, clearly showing the encapsulation of discrete Ag nanoparticles having an average diameter of about 50 nm. The presence of Ag nanoparticles at the interface between the two diamond layers was further confirmed using EDS (data not shown).

FIGS. 8A-8D demonstrate the control over the size of the Ag nanoparticles by the thickness of the deposited Ag layer. In FIG. 8A, a 10 nm thick Ag layer provides Ag nanoparticles having diameters between about 10 nm and 20 nm. In FIG. 8B, a 20 nm thick Ag layer provides Ag nanoparticles having diameters between about 30 nm and 50 nm. In FIG. 8C, a 30 nm thick Ag layer provides Ag nanoparticles having diameters between about 80 nm and 200 nm. In FIG. 8D, a 50 nm thick Ag layer provides Ag nanoparticles having diameters between about 200 nm and 500 nm.

FIGS. 9A-9B show SEM images of the diamond-seeded Ag film after the microwave plasma treatment. In this case, however, the diamond-seeded Ag film was formed on a quartz substrate. As with FIGS. 6A-6B, above, the images clearly show the dewetting of the Ag film into discrete Ag nanoparticles having an average diameter of about 50 nm. Again, the Ag particles are uniform in shape, size and distribution across the underlying diamond layer.

FIG. 10 shows a diffuse reflectance spectrum of the diamond-seeded Ag film on quartz after the microwave plasma treatment.

FIG. 11A shows a camera image of a diamond layer on silicon without embedded particles. FIG. 11B shows a camera image of a diamond layer on silicon with embedded Ag nanoparticles. FIG. 11B demonstrates the coloration of diamond possible using the embedded Ag nanoparticles as compared to the black film of FIG. 11A.

FIG. 12 demonstrates that the use of commercially available Ag nanoparticles cannot provide the disclosed plasmonic diamond films. In this case, the experiment was repeated as described above except for dispersing commercially available Ag nanoparticles (diameter of about 30 nm) on the surface of the first layer of diamond, instead of depositing a layer of Ag. The Ag nanoparticle powder was dispersed in water and dropped on to the first layer of diamond, followed by drying. The resulting SEM image shows that the Ag nanoparticles form highly irregularly shaped aggregates having non-uniform sizes, shapes and a non-uniform distribution across the surface of the diamond.

Example 3: Tunable Coloration of Diamond Films by Encapsulation of Plasmonic Ag Nanoparticles Introduction Chemical Vapor Deposition (CVD) grown diamond films are widely used as coating materials. While diamond thin films are typically clear or slightly gray in color, this Example demonstrates that diamond films of different optical properties and exhibiting different colors can be prepared by embedding Ag nanoparticles into the diamond film. Microwave heating of Ag thin films deposited onto H-terminated diamond films grown on transparent fused silica substrates leads to de-wetting and formation of a high density of size-controlled Ag nanoparticles. Surprisingly, scanning electron microscopy and transmission electron microscopy show that subsequent growth of a second diamond layer encapsulates the Ag nanoparticles without significant additional aggregation or ripening, forming dense arrays of diamond-encapsulated Ag nanoparticles. This Example demonstrates the ability to make diamond films in a range of colors that exhibit wavelength-dependent optical properties characteristic of plasmonic effects. Electromagnetic field modeling of nanoparticle scattering and absorption was performed for comparison with experimental results.

Materials and Methods

Growth of Colored Diamond-Ag-Diamond Films.

Fused silica substrates were cut into 1×1 $cm^2$ pieces and cleaned by sonication with acetone and water for 10 min respectively, and then seeded by spin-coating 1 ml suspension of 100 nm diamond powder in a spin-coater with 3000 rpm for 30 seconds [30]. Diamond thin films were grown using microwave plasma enhanced chemical vapor deposition (PECVD) in a modified AsTex system. Diamond films were grown using 200 standard cubic centimeters per minute (sccm) $H_2$ and 3 sccm $CH_4$ at a power of 800 W, at a pressure of 48 torr. The first diamond layer was grown for 15 min, and then transferred to an electron-beam metal evaporator and Ag films with different thicknesses were deposited at a rate of 0.1 Å/s. Films of 10, 20, and 50 nm thickness were used. After Ag film growth, the samples were immediately returned to the diamond PECVD system and exposed to a $H_2$ plasma to form the plasmonic Ag films. While varying times and power levels were explored, samples shown here were grown using 600 W and a time of 10 minutes. To encapsulate the Ag nanoparticles (NPs), a second diamond layer on the sample was grown immediately after de-wetting, using 200 sccm $H_2$ and 3 sccm $CH_4$ at a power of 800 W for 15 min. As part of the growth of the second diamond layer, the $H_2$-plasma treated surface was first seeded with diamond powder. In some cases, samples were removed at various stages of this procedure to characterize the size, shape, and other properties of the films.

Diamond Film Characterization.

Scanning electron microscopy (SEM) and Energy-Dispersive X-Ray Spectroscopy (EDS) measurements were carried out using a Leo Gemini Supra 55 VP field-emission scanning electron microscope. To best capture the film morphology, an SE2 detector was used for imaging. Energy dispersive X-ray spectra were obtained on this same instrument using a ThermoFisher UltraDry Compact EDS detector. Transmission electron microscopy (TEM) characterization was performed using a Tecnai TF-30 microscope operating at accelerating voltage of 300.0 kV. Raman spectroscopy was performed using Aramis Confocal Raman Microscope with excitation at 442 nm. Optical transmission spectra were collected using Shimadzu 2401PC double-beam ultraviolet-visible spectrophotometer.

Results and Discussion

First, the diamond film embedded with Ag NPs was characterized at different growth stages of preparation using SEM. As shown in FIG. 13A, the initial diamond layer grown on fused silica is composed of crystallites with typical facet sizes of 100-200 nm. FIG. 13B shows the surface morphology after a 20 nm thick Ag film was deposited on the sample, transferred back to the PECVD chamber, and exposed to a $H_2$ plasma for 10 min. In FIG. 13B it is clear that the Ag film de-wetted into finely dispersed, approximately spherical Ag NPs with diameters ranging from 10-40 nm, while the diamond in regions surrounding the Ag NPs maintains its original morphology. FIG. 1C shows an SEM image after another layer of diamond was grown on the de-wetted Ag NP layer, thereby forming a $SiO_2$-diamond-Ag-diamond structure in which the Ag nanoparticles are completely encapsulated and therefore protected from external chemical or mechanical impacts.

To show that the resulting structures have Ag within the diamond layers but not on the topmost surface, energy-dispersive X-ray spectroscopy (EDS) and X-ray photoelectron spectroscopy (XPS) were used. EDS spectra were obtained using an electron acceleration voltage of 25 kV (data not shown). In this case the x-ray emission was clearly detected, while a spatial map showed no detectable spatial variation, consistent with the limited spatial resolution of EDS and the close spacing between Ag NPs (revealed in SEM). At lower electron acceleration voltages of 5 kV (data not shown), no Ag x-ray emission was observed. To show that the Ag is not present at significant concentrations on top of the diamond surface, XPS spectra were obtained (data not shown). No Ag signal was detected, while the C(1s) peak showed a single narrow peak typical of diamond. The combination of EDS and XPS shows that Ag is present within the diamond film but is not present on the top surface.

The introduction of Ag alters the growth morphology and leads to some increased in graphitic carbon. Raman spectra of the initial diamond film and of the diamond-Ag-diamond composite structure were obtained (data not shown). Both samples exhibit a sharp peak near 1330 $cm^{-1}$, close to the 1332 $cm^{-1}$ diamond peak. In addition, broader peaks near 1370 and 1580 $cm^{-1}$ are observed; these peaks are frequently attributed to the "D" and "G" bands of graphitic material, respectively [31]. Note that the cross-section for Raman scattering of $sp^2$-hybridized carbon is approximately 100 times higher than that for $sp^3$-hybridized diamond. Therefore, the results show that the diamond film has good diamond quality [32, 33]. The D-Ag-D also has another peak at around 1150 $cm^{-1}$, which is reported as the nanocrystalline diamond peak [34, 35].

FIG. 14 shows the changes in the optical properties as measured in transmission, along with photographs of the samples when held above a white background with "1", "2", and "3" written on the paper. The transmission spectrum of pure diamond on fused silica ($SiO_2$) shows no obvious peaks across the UV to visible region with only a slow increase at shorter wavelengths due to the increased reflectivity. After deposition and dewetting of the Ag film, an obvious peak near 360 nm can be observed, along with a broader peak at 500 nm. As will be discussed below, plasmon features of Ag nanoparticles frequency consist of a short-wavelength quadrupole mode and a longer-wavelength dipole mode [36]. After growth of the second diamond film, the spectrum is more complicated and shows peaks at 378, 495, and 650 nm. The absorption spectrum of sample (3) is qualitatively similar to that presented by Shen, et al. from diamond samples that were $Ag^+$-implanted and then annealed to form Ag nanoparticles [24]. FIG. 14 also shows photographs of the three samples held above a white background, illuminated from above. The diamond-on-quartz sample (1) is white, the de-wetted Ag nanoparticles on diamond (2) appears yellow, while the film with diamond-encapsulated Ag nanoparticles (3) appears red. In each case the films remain transparent, as text underneath the samples can be read clearly. This color change clearly results from the embedded Ag NPs with strong plasmonic effects in diamond films.

Control of Optical Properties by Changing Nanoparticle Diameter.

By varying the thickness of the deposited Ag film, the size distribution of the Ag nanoparticles can be varied. SEM images were used to measure nanoparticle size distributions produced by de-wetting of Ag films of nominal thicknesses of 10, 20, and 50 nm (data not shown). Ag films 10 nm thickness produced Ag nanoparticles ranging from 10 nm to 20 nm in diameter, and 20 nm Ag films produce nanoparticles primarily in the 20-30 nm size range. As the initially deposited layer thickness increases to 50 nm, the Ag nanoparticle diameters increase rapidly to 100-300 nm, and the shape of the particles begins to exhibit some slight elongation.

FIG. 15 shows optical transmission spectra of diamond-encapsulated Ag nanoparticles made starting with Ag films of 10, 20, and 50 nm thickness. With the 10 and 20 nm films, the feature near 360 nm wavelength is retained. The feature attributed to the dipolar plasmon resonance shifts from ~480 nm for 10 nm thick Ag to 510 nm for 20 nm thick Ag. For 50 nm Ag dewetting as the Ag NPs became larger, the maximum extinction occurs at ~550 nm. It can be concluded that by changing the Ag layer thickness, the dewetting Ag NPs with different sizes exhibit different optical responses resulting from the plasmonic peak shifts. FIG. 15 also shows the actual optical images of ~5 mm square regions (right), demonstrating changes in color as the nanoparticle size changes. Some lateral variations in occur, arising from changes in the temperature across the sample that, in turn, alters the size distribution of the nanoparticles and the associated plasmonic resonances.

To better understand how different processing conditions alter nanoparticle shape and spatial distribution, transmission electron microcopy was used to characterize the D-Ag-D composite films during initial stages of growth of the second diamond layer. In this case growth of the second layer was interrupted, and the films were fractured from the $SiO_2$ substrate to expose thin regions suitable for TEM imaging. FIG. 16A-C shows TEM images through the diamond-Ag-diamond layers. FIG. 16A shows that starting with a 10 nm Ag film, after dewetting and encapsulation the diamond film has a very high density of embedded Ag NPs with diameters of 10-20 nm, corresponding well with the size-distribution results from the SEM images. Close examination shows lattice images in some of the Ag NPs. Starting with a thicker 20 nm Ag film, FIG. 16B shows embedded Ag nanoparticles with diameters of 20-50 nm. Close examination of images of smaller-sized nanoparticles shows an abrupt interface from Ag to diamond, with no evidence for onion-like graphite nanoshells or other structures. Starting with a 50 nm Ag film, the TEM image in FIG. 16C shows formation of Ag NPs (frequently non-spherical) with diameters of 100-300 nm. In this case TEM images clearly show that each nanoparticle has a diamond shell grown around it, visible as a slightly darkened halo. Further close examination of the TEM images reveals the characteristic columnar growth of diamond, again with no significant evidence of graphitic layers or other structures. Overall, the data show that samples starting with Ag layers <30 nm in diameter lead to abrupt interfaces and dense arrays of diamond-embedded Ag nanoparticles as shown in FIGS. 16A and 16B. For samples with initial Ag layers >50 nm in thickness, halting the growth of the diamond overcoat shows nanoparticles with core-shell structures like those shown in FIG. 16C. Further studies show that when the second layer growth is continued for a longer time, the core-shell structures visible in FIG. 16C merge into a continuous film resembling those in FIGS. 16A and 16B. In addition, when growth of the second layer is halted after shorter periods of time, core-shell structures are also observed from 10 nm and 20 nm Ag films. From these studies, it is concluded that the transition from continuous film (FIGS. 16A, 16B) to core-shell structure (FIG. 16C) reflects different stages in a common growth process. That is, for all Ag thicknesses, growth of a second diamond layer shows core-shell structures at short growth times and a continuous film at longer growth times.

Modeling of Plasmonic Resonances.

The spectra and visible optical properties are clearly a result of size-dependent plasmonic resonances of the Ag nanoparticles. The features observed are similar to those reported by Shen and co-workers for Ag/diamond nanocomposites made by ion implantation and annealing [24]. For a single isolated nanoparticle, Mie theory predicts that the cross-section for scattering is given by [37, 38]

$$E(\lambda) = \frac{24\pi^2 a^3 \epsilon_m^{3/2}}{\lambda \ln(10)} \left[ \frac{\epsilon_i(\lambda)}{(\epsilon_r(\lambda) + 2\epsilon_m(\lambda))^2 + \epsilon_i(\lambda)^2} \right] \quad \text{(Equation 1)}$$

where $\alpha$ is the nanoparticle radius, $\lambda$ is the wavelength of light, $\epsilon_r$ and $\epsilon_i$ are the real and imaginary parts of the dielectric constant of the nanoparticle, and $\epsilon_m$ is the dielectric constant of the surrounding matrix (which is assumed to be lossless). The real ($\epsilon_r$) and imaginary ($\epsilon_i$) parts of the complex dielectric function are related to the index of refraction n and absorption coefficient k by $\epsilon_r = n^2 - k^2$ and $\epsilon_i = 2nk$. The factor in brackets resembles a Lorentzian-like function that reaches a maximum when $\epsilon_r(\lambda) + 2\epsilon_m(\lambda) = 0$. Based on published values of optical constants for Ag and for diamond, this simple equation predicts a resonance near 385 nm for Ag nanoparticles in air ($\epsilon_m = 1$), which shifts to 580 nm in (lossless) diamond ($n = 2.41$, $\epsilon_m = n^2 = 5.81$). However, for particles larger than ~20 nm diameter, additional quadrupolar and higher-order modes become important [39]. Deviations for perfect sphericity and coupling between nanoparticles can also play a role [40].

In order to understand the factors controlling the optical properties of the nanoparticle-embedded diamond films, finite element modeling as implemented in Comsol Multiphysics was used to simulate the scattering and absorption from silver nanoparticles embedded in a diamond matrix. These calculations include the wavelength-dependent index of refraction (n) and absorption constant (k) for silver and diamond. A background electromagnetic field of 1 V/m and the scattering formalism was used to solve Maxwell's equations for the 3-dimensional model in the presence of this background field. The spherically symmetric embedding matrix (air or diamond) was terminated with a perfectly matched layer at the boundaries to simulate nanoparticles imbedded in an infinitely thick diamond shell. While this approach has been shown previously to yield highly accurate result [41], a limited number of comparisons were also performed (not shown) with results from direct dipole scattering calculations [42]. The precise resonance frequencies for Ag are dependent on the optical constants used. Data presented here use optical constants recently recommended by Jiang, et al. [43, 44] For diamond, both parameterized constants for single-crystal diamond and published data for CVD diamond films were explored [28, 45]. Yin, et al. reported values of n and k for a variety of diamond thin films produced by chemical vapor deposition under conditions similar to those used here; Yin's data show that n is nearly constant through the visible range, while k varies linearly with wavelength. Based on their data, a constant value of n=2.13 was used and the values of k were parameterized as $k(\lambda) = 0.042 - 5.17 \times 10^4 (\lambda - 2.00 \times 10^{-7})$ where $\lambda$ is the wavelength in meters [28].

Absolute absorption, scattering, and extinction (sum of absorption and scattering) cross-sections for 30, 40, 50, and 70 nm diameter Ag nanoparticles embedded in diamond were obtained (data not shown). The results show that the small 30 nm nanoparticles are dominated by a single mode near 550 nm, as predicted by Equation 1; in addition, there is a small feature at shorter wavelength near 480 nm due to a quadrupolar resonance term. For larger nanoparticles, the dipolar peak shifts significantly to longer wavelength and becomes broader, while the quadrupolar peak shifts only slightly in wavelength. The amplitude of the quadrupolar peak also becomes more important for larger nanoparticle size, in agreement with prior studies of Ag nanoparticle films in other dielectric media [46]. The spatial distribution of the magnitude of the electric field at 525 and 675 nm, near the peak of the quadrupolar and dipolar modes, was also examined (data not shown). For 70 nm nanoparticles, these images reveal a localized electric field enhancement of 10-15 times at the nanoparticle surface. Since the intensity of light varies like $E^2$, this corresponds to local increase in intensity by a factor of 100-200 times.

While many of the qualitative features of the nanoparticles are reproduced by the calculations described above, a simple model using isolated nanoparticles does not accurately reproduce the spectra due to the dispersion of sizes, the presence of non-sphericity in the nanoparticles (see FIG. 16C), and the coupling that occurs between nanoparticles at such close distances [39, 40, 47]. The features near 385 nm are similar to those observed for nanoparticle aggregates and have been observed for Ag nanoparticles in or on other dielectric media such as $SiO_2$ [36] and sapphire [48]. Thus, at the high densities used here, coupling between nanoparticles becomes important and is not accounted for in the simple modeling described above.

While the optical properties of dense, random nanoparticle arrays may be difficult to model accurately, examination of the trends in the calculations show a number of important features. For example, the presence of peaks in the optical absorption spectra in the range of 475-600 nm show that that, in agreement with the TEM images, a large fraction of the nanoparticles persist as sub-100 nm nanoparticles after growth. It is noted that nanoparticle scattering varies with the $3^{rd}$ power of radius, such that the largest particles dominate the spectrum. Additional calculations (not shown) in which an additional <2 nm absorptive shell of graphitic carbon was incorporated immediate adjacent to the Ag nanoparticles show that the graphitic layer on the Ag nanoparticle should selectively quench the short-wavelength features. Thus, the presence of optical resonance features below ~500 nm indicates that the boundary between Ag and diamond is abrupt and not mediated by multilayers or onion-like layers of graphite, in agreement with the abrupt interfaces visible in TEM.

Conclusions

The results of this Examples demonstrate a new approach to preparation of densely colored diamond thin films by using the plasmonic properties of Ag nanoparticles embedded into a diamond thin film. While significant coarsening of nanoparticles might be expected under conditions of diamond growth, the results show that Ag nanoparticles produced on H-terminated diamond retain their small size sufficiently long to enable encapsulation of the nanoparticles into the growing diamond film. The optical properties clearly demonstrate plasmonic resonances and are qualitatively similar to those expected from electric field modeling and prior studies of Ag nanoparticle arrays in other dielectric media. While demonstrated here with a single layer of nanoparticles, even more intensely colored films may be formed by repeated application. Additionally, greater control over the plasmonic features could be achieved using lithographic patterning techniques. Nevertheless, the work reported here demonstrates a convenient method for imparting tunable color to diamond via encapsulation of Ag nanoparticles.

REFERENCES

[1] P. W. May, Diamond thin films: a 21st-century material. Philos. Trans. R. Soc. Lond. Ser. A-Math. Phys. Eng. Sci., 358 (2000) 473-495.
[2] L. S. Hounsome, R. Jones, P. M. Martineau, D. Fisher, M. J. Shaw, P. R. Briddon, S. Oberg, Origin of brown coloration in diamond. Phys. Rev. B, 73 (2006) 8.
[3] P. Sacerdote, Changes in coloration of diamonds under the effect of various physical agents. C. R. Hebd. Seances Acad. Sci., 149 (1909) 993-994.
[4] F. Jelezko, J. Wrachtrup, Single defect centres in diamond: A review. Phys. Status Solidi A-Appl. Mat., 203 (2006) 3207-3225.
[5] F. De Weerdt, J. Van Royen, Defects in coloured natural diamonds. Diam. Relat. Mat., 10 (2001) 474-479.
[6] C. J. Murphy, T. K. Sau, A. Gole, C. J. Orendorff, Surfactant-directed synthesis and optical properties of one-dimensional plasmonic metallic nanostructures. Mrs Bulletin, 30 (2005) 349-355.
[7] P. K. Jain, X. H. Huang, I. H. El-Sayed, M. A. El-Sayed, Noble Metals on the Nanoscale: Optical and Photothermal Properties and Some Applications in Imaging, Sensing, Biology, and Medicine. Accounts Chem. Res., 41 (2008) 1578-1586.
[8] S. L. Zou, G. C. Schatz, Narrow plasmonic/photonic extinction and scattering line shapes for one and two dimensional silver nanoparticle arrays. J. Chem. Phys., 121 (2004) 12606-12612.
[9] H. Wang, D. W. Brandt, P. Nordlander, N. J. Halas, Plasmonic nanostructures: Artificial molecules. Accounts Chem. Res., 40 (2007) 53-62.
[10] J. A. Schuller, E. S. Barnard, W. Cai, Y. C. Jun, J. S. White, M. L. Brongersma, Plasmonics for extreme light concentration and manipulation. Nature Materials, 9 (2010) 193-204.
[11] S. Linic, P. Christopher, D. B. Ingram, Plasmonic-metal nanostructures for efficient conversion of solar to chemical energy. Nature materials, 10 (2011) 911-921.
[12] M. A. García, Surface plasmons in metallic nanoparticles: fundamentals and applications. Journal of Physics D: Applied Physics, 44 (2011) 283001.
[13] M. Rycenga, C. M. Cobley, J. Zeng, W. Li, C. H. Moran, Q. Zhang, D. Qin, Y. Xia, Controlling the synthesis and assembly of silver nanostructures for plasmonic applications. Chemical Reviews, 111 (2011) 3669-3712.
[14] S. Moldovan, L. Roiban, D. Georgescu, L. Baia, O. Ersen, Thermal evolution of silver nanoparticles onto porous $TiO_2$ nanostructures. Catal. Today, 284 (2017) 221-228.
[15] J. M. Sun, D. Ma, H. Zhang, X. M. Liu, X. W. Han, X. H. Bao, G. Weinberg, N. Pfander, D. S. Su, Toward monodispersed silver nanoparticles with unusual thermal stability. J. Am. Chem. Soc., 128 (2006) 15756-15764.
[16] J. Siegel, P. Jurik, Z. Kolska, V. Svorcik, Annealing of silver nanolayers sputtered on polytetrafluoroethylene. Surf. Interface Anal., 45 (2013) 1063-1066.
[17] S. Meskinis, A. Ciegis, A. Vasiliauskas, K. Slapikas, R. Gudaitis, I. Yaremchuk, V. Fitio, Y. Bobitski, S. Tamulevicius, Annealing Effects on Structure and Optical Properties of Diamond-Like Carbon Films Containing Silver. Nanoscale Res. Lett., 11 (2016) 146.
[18] I. Yaremchuk, A. Tamuleviciene, T. Tamulevicius, K. Slapikas, Z. Balevicius, S. Tamulevicius, Modeling of the plasmonic properties of DLC-Ag nanocomposite films. Phys. Status Solidi A-Appl. Mat., 211 (2014) 329-335.
[19] S. Hussain, R. K. Roy, A. K. Pal, Incorporation of silver nanoparticles in DLC matrix and surface plasmon resonance effect. Mater. Chem. Phys., 99 (2006) 375-381.
[20] F. R. Marciano, L. F. Bonetti, R. S. Pessoa, J. S. Marcuzzo, M. Massi, L. V. Santos, V. Trava-Airoldi, The improvement of DLC film lifetime using silver nanoparticles for use on space devices. Diam. Relat. Mat., 17 (2008) 1674-1679.
[21] H. W. Choi, J. H. Choi, K. R. Lee, J. P. Ahn, K. H. Oh, Structure and mechanical properties of Ag-incorporated DLC films prepared by a hybrid ion beam deposition system. Thin Solid Films, 516 (2007) 248-251.
[22] S. F. Ahmed, M. W. Moon, K. R. Lee, Effect of silver doping on optical property of diamond like carbon films. Thin Solid Films, 517 (2009) 4035-4038.
[23] B. Ghosh, S. C. Ray, R. Espinoza-Gonzalez, R. Villarroel, S. A. Hevia, P. Alvarez-Vega, Surface plasmon effect in electrodeposited diamond-like carbon films for photovoltaic application. Chem. Phys. Lett., 698 (2018) 60-66.
[24] Y. Y. Shen, T. Qi, Y. Qiao, H. J. Hei, Z. Y. He, S. W. Yu, Optical, electrical and microstructural properties of nanocomposite Ag/diamond by Ag ion implantation and subsequent annealing. Vacuum, 123 (2016) 160-166.
[25] N. Savvides, Optical constants and associated functions of metastable diamodn-like amorphous-carbon films in the energy range 05-7.3 eV. J. Appl. Phys., 59 (1986) 4133-4145.
[26] Y. Lifshitz, G. D. Lempert, E. Grossman, H. J. Scheibe, S. Voellmar, B. Schultrich, A. Breskin, R. Chechik, E. Shefer, D. Bacon, R. Kalish, A. Hoffman, Optical and photoemission studies of DLC films prepared with a systematic variation of the $sp^3:sp^2$ composition. Diam. Relat. Mat., 6 (1997) 687-693.
[27] D. Franta, L. Zajickova, I. Ohlidal, J. Janca, Optical characterization of diamond-like carbon films. Vacuum, 61 (2001) 279-283.
[28] Z. Yin, Z. Akkerman, B. X. Yang, F. W. Smith, Optical properties and microstructure of CVD diamond films. Diam. Relat. Mat., 6 (1997) 153-158.
[29] V. V. Sobolev, A. P. Timonov, V. V. Sobolev, Spectra of optical functions and transitions in diamond. Opt. Spectrosc., 88 (2000) 217-221.
[30] S. Li, J. A. Bandy, R. J. Hamers, Enhanced photocatalytic activity of diamond thin films using embedded Ag nanoparticles. ACS Appl. Mater. Interfaces, 10 (2018) 5395-5403.
[31] A. C. Ferrari, J. Robertson, Interpretation of Raman spectra of disordered and amorphous carbon. Phys. Rev. B, 61 (2000) 14095-14107.
[32] S. R. Sails, D. J. Gardiner, M. Bowden, J. Savage, D. Rodway, Monitoring the quality of diamond films using Raman spectra excited at 514.5 nm and 633 nm. Diam. Relat. Mat., 5 (1996) 589-591.
[33] D. S. Knight, W. B. White, Characterization of diamond films by Raman spectroscopy. Journal of Materials Research, 4 (1989) 385-393.
[34] S. Michaelson, A. Stacey, J. Orwa, A. Cimmino, S. Prawer, B. Cowie, O. Williams, D. Gruen, A. Hoffman, Bulk and surface thermal stability of ultra nanocrystalline diamond films with 10-30 nm grain size prepared by chemical vapor deposition. J. Appl. Phys., 107 (2010) 093521.
[35] A. C. Ferrari, J. Robertson, Raman signature of bonding and disorder in carbons, in: J. P. Sullivan, J. Robertson, O. Zhou, T. B. Allen, B. F. Coll (Eds.) Amorphous and Nanostructured Carbon, Materials Research Society, Warrendale, 2000, pp. 299-304.
[36] X. Liu, D. Li, X. Sun, Z. Li, H. Song, H. Jiang, Y. Chen, Tunable dipole surface plasmon resonances of silver nanoparticles by cladding dielectric layers. Sci Rep, 5 (2015).
[37] A. Pinchuk, G. von Plessen, U. Kreibig, Influence of interband electronic transitions on the optical absorption in metallic nanoparticles. Journal of Physics D: Applied Physics, 37 (2004) 3133.
[38] T. R. Jensen, M. D. Malinsky, C. L. Haynes, R. P. Van Duyne, Nanosphere lithography: Tunable localized surface plasmon resonance spectra of silver nanoparticles. J. Phys. Chem. B, 104 (2000) 10549-10556.
[39] P. K. Jain, M. A. El-Sayed, Plasmonic coupling in noble metal nanostructures. Chem. Phys. Lett., 487 (2010) 153-164.
[40] S. L. Zou, L. L. Zhao, G. C. Schatz, Extinction spectra of silver nanoparticle arrays, in: N. J. Halas (Ed.) Plasmonics: Metallic Nanostructures and Their Optical Properties, SPIE-Int Soc Optical Engineering, Bellingham, 2003, pp. 174-181.
[41] M. Karamehmedovic, R. Schuh, V. Schmidt, T. Wriedt, C. Matyssek, W. Hergert, A. Stalmashonak, G. Seifert, O. Stranik, Comparison of numerical methods in near-field computation for metallic nanoparticles. Opt. Express, 19 (2011) 8939-8953.
[42] B. T. Draine, P. J. Flatau, discrete-dipole approximation for scattering calculation. J. Opt. Soc. Am. A-Opt. Image Sci. Vis., 11 (1994) 1491-1499.
[43] Y. J. Jiang, S. Pillai, M. A. Green, Re-evaluation of literature values of silver optical constants. Opt. Express, 23 (2015) 2133-2144.
[44] Y. J. Jiang, S. Pillai, M. A. Green, Realistic Silver Optical Constants for Plasmonics. Sci Rep, 6 (2016) 7.
[45] S. Webster, Y. Chen, G. Turri, A. Bennett, B. Wickham, M. Bass, Intrinsic and extrinsic absorption of chemical vapor deposition single-crystal diamond from the middle ultraviolet to the far infrared. J. Opt. Soc. Am. B-Opt. Phys., 32 (2015) 479-484.
[46] N. G. Bastus, J. Piella, V. Puntes, Quantifying the Sensitivity of Multipolar (Dipolar, Quadrupolar, and Octapolar) Surface Plasmon Resonances in Silver Nanoparticles: The Effect of Size, Composition, and Surface Coating. Langmuir, 32 (2016) 290-300.
[47] P. K. Jain, W. Y. Huang, M. A. El-Sayed, On the universal scaling behavior of the distance decay of plasmon coupling in metal nanoparticle pairs: A plasmon ruler equation. Nano Lett., 7 (2007) 2080-2088.
[48] M. M. Jiang, H. Y. Chen, B. H. Li, K. W. Liu, C. X. Shan, D. Z. Shen, Hybrid quadrupolar resonances stimulated at short wavelengths using coupled plasmonic silver nanoparticle aggregation. J. Mater. Chem. C, 2 (2014) 56-63.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a plasmonic diamond film, the method comprising:
   (a) forming a first layer of diamond on a substrate;
   (b) depositing a layer of a metal on a surface of the first layer of diamond to form an as-deposited layer of metal;
   (c) exposing the as-deposited layer of metal to a plasma treatment to convert the as-deposited layer of metal to a plurality of discrete regions of the metal on the surface of the first layer of diamond; and
   (d) forming a second layer of diamond on the plurality of discrete regions of metal to form the plasmonic diamond film comprising a plurality of plasmonic nanoparticles.

2. The method of claim 1, wherein the second layer encapsulates the plurality of discrete regions of the metal to provide the plurality of plasmonic nanoparticles embedded within a continuous diamond matrix.

3. The method of claim 1, wherein the second layer encapsulates the plurality of discrete regions of the metal to provide the plurality of plasmonic nanoparticles as core-shell plasmonic nanoparticles distributed on the surface of the first layer of diamond, each core-shell plasmonic nanoparticle comprising a core of the metal and a diamond shell thereover.

4. The method of claim 3, wherein the surface of the first layer of diamond between the core-shell plasmonic nanoparticles is uncoated by the second layer of diamond.

5. The method of claim 1, wherein the diamond of the first layer of diamond is hydrogen-terminated diamond.

6. The method of claim 1, wherein the diamond of the first and second layers of diamond is polycrystalline diamond.

7. The method of claim 1, wherein the metal is selected from Cu, Ag, Au, Pt, Al, Co, Pd, and combinations thereof.

8. The method of claim 1, wherein the metal is selected from Ag, Au, Cu, Al, and combinations thereof.

9. The method of claim 8, wherein the plurality of plasmonic nanoparticles have an average diameter of less than 100 nm.

10. The method of claim 1, wherein the as-deposited layer of metal has an average thickness in the range of from 1 nm to 100 nm.

11. The method of claim 1, wherein the plasma treatment in step (c) is an $H_2$ plasma treatment.

12. The method of claim 1, wherein the as-deposited layer of metal is seeded with diamond prior to the plasma treatment in step (c).

13. The method of claim 1, further comprising repeating steps (b)-(d) of the method one or more times to form a multi-layer plasmonic diamond structure.

14. The method of claim 1, wherein the metal is Ag and the second layer encapsulates the plurality of discrete regions of Ag to provide the plurality of plasmonic nanoparticles as core-shell plasmonic nanoparticles distributed on the surface of the first layer of diamond, each core-shell plasmonic nanoparticle comprising an Ag core and a diamond shell thereover.

15. The method of claim 14, wherein the surface of the first layer of diamond between the core-shell plasmonic nanoparticles is uncoated by the second layer of diamond.

16. The method of claim 14, wherein the diamond of the first layer of diamond is hydrogen-terminated diamond.

17. The method of claim 14, wherein the diamond of the shell is polycrystalline diamond.

18. The method of claim 14, wherein the as-deposited layer of Ag has an average thickness in the range of from 1 nm to 100 nm and the diamond shells have an average thickness in the range of from 1 nm to 100 nm.

19. The method of claim 14, wherein the plasma treatment is an $H_2$ plasma treatment.

20. The method of claim 14, wherein Ag cores of the core-shell plasmonic nanoparticles have an average diameter of less than 100 nm.

* * * * *